United States Patent [19]

Sato et al.

[11] Patent Number: 5,892,730
[45] Date of Patent: Apr. 6, 1999

[54] SYNCHRONOUS SEMICONDUCTOR MEMORY DEVICE OPERABLE IN A PLURALITY OF DATA WRITE OPERATION MODES

[75] Inventors: Nobuyuki Sato; Hisashi Iwamoto, both of Hyogo, Japan

[73] Assignees: Mitsubishi Denki Kabushiki Kaisha; Mitsubishi Electric Engineering Co., Ltd., both of Tokyo, Japan

[21] Appl. No.: 980,963

[22] Filed: Dec. 1, 1997

[30] Foreign Application Priority Data

May 29, 1997 [JP] Japan .................................. 9-139715

[51] Int. Cl.$^6$ ...................................................... G11C 8/00
[52] U.S. Cl. ................. 365/233; 365/189.05; 365/230.03
[58] Field of Search ............................... 365/233, 189.05, 365/189.01, 230.08, 230.03

[56] References Cited

U.S. PATENT DOCUMENTS

| | | | |
|---|---|---|---|
| 5,537,354 | 7/1996 | Mochizuki et al. ............... | 365/189.04 |
| 5,544,124 | 8/1996 | Zagar et al. ....................... | 365/230.08 |
| 5,568,445 | 10/1996 | Park et al. ............................. | 365/233 |
| 5,815,462 | 9/1998 | Konishi et al. .......................... | 365/233 |

FOREIGN PATENT DOCUMENTS 7-169263  7/1995  Japan .

OTHER PUBLICATIONS

"A 25ns Clock Access 250MHz 256Mb SDRAM with a Synchronous Mirror Delay", Saeki et al., ISSCC96, Session 23, DRAM Paper SP 23.4, Feb. 10, 1996.

*Primary Examiner*—Huan Hoang
*Attorney, Agent, or Firm*—McDermott, Will & Emery

[57] ABSTRACT

A synchronous semiconductor memory device can achieve either of a pipelined mode and a prefetch mode with one chip. In accordance with CAS (column address strobe) latency 4 instructing signal MCL4 stored in a mode register, a sequence of generation of control signals from a control signal generating circuit is set to either the pipelined mode or the prefetch mode. A mode switching circuit merely switches reset timings of a write buffer in accordance with a CAS latency. Therefore, the internal data write mode can be easily switched in accordance with an operation environment, and the synchronous semiconductor memory device can implement multiple data write modes with one chip.

6 Claims, 25 Drawing Sheets

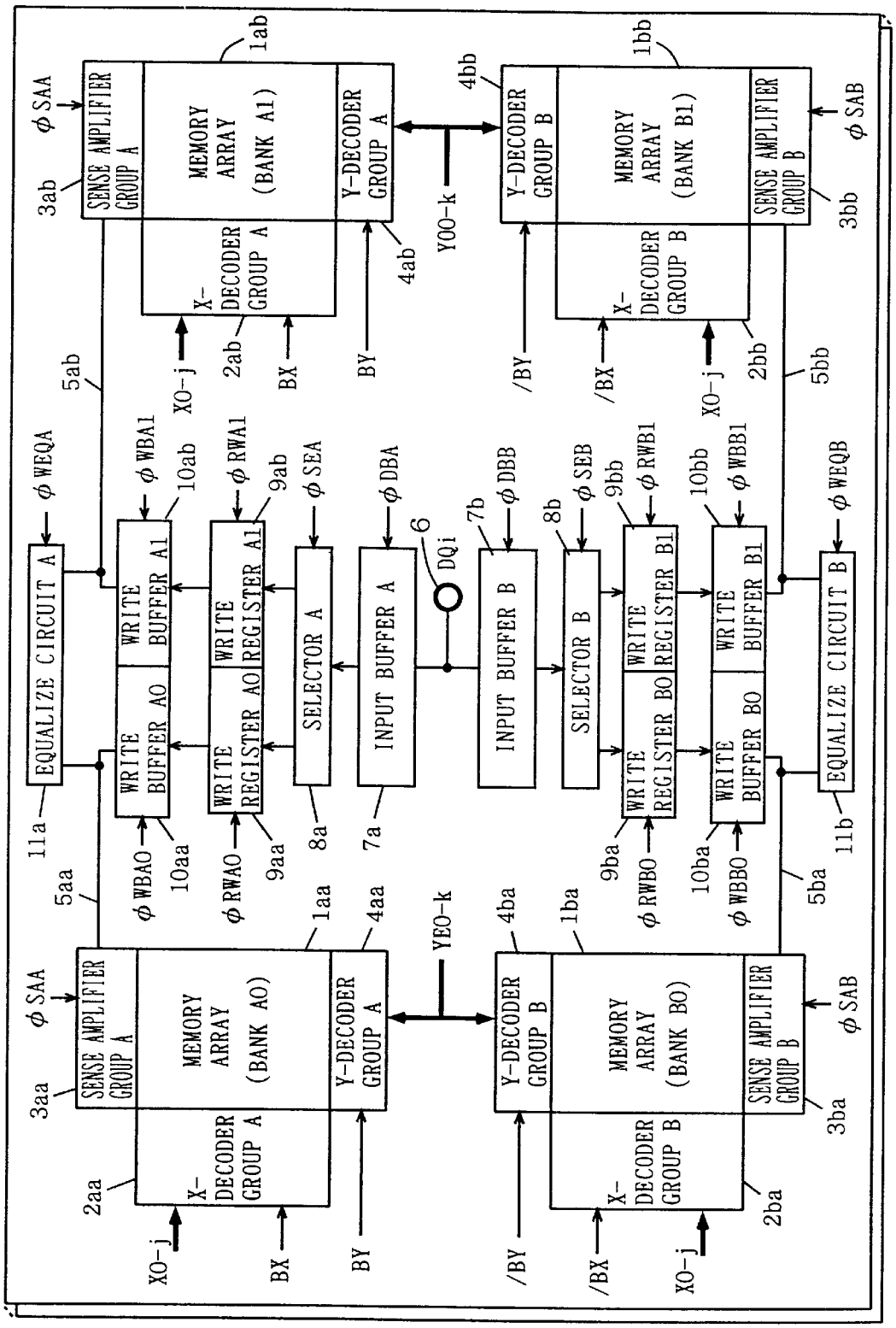
F I G. 1

DRT:DOUBLE DATA RATE

DRT:SINGLE DATA RATE

F I G. 3 9  PRIOR ART

SYNCHRONOUS SEMICONDUCTOR MEMORY DEVICE OPERABLE IN A PLURALITY OF DATA WRITE OPERATION MODES

BACKGROUND OF THE INVENTION

1. Field of the Invention

The present invention relates to a synchronous semiconductor memory device which takes in an external signal in synchronization with an externally and periodically supplied clock signal, and in particular to a structure of a data writing portion in a synchronous dynamic random access memory (SDRAM) allowing random access.

2. Description of the Background Art

In processing systems, operation speeds of dynamic random access memories used as main memories have been increased, but are still low compared with operation speeds of microprocessors (MPUs). It has often been reported that the above fact increases a wait time of the microprocessor, and impedes fast processing, as an access time and a cycle time of the DRAM form a bottleneck in a whole system performance. In order to eliminate a difference in operation speed between the DRAM and the microprocessor, clock synchronous semiconductor memory devices which operate in synchronization with a clock signal have recently been developed, and SDRAMs have been used as main memories for fast microprocessors.

In this SDRAM, take-in of external signals, i.e., address signals and control signals as well as input/output of data are performed in synchronization with a clock signal which is, for example, a system clock. Since the external signals are taken into the device in synchronization with the clock signal, it is not necessary to take a margin for skew of these external signals into consideration, and an internal operation can be started rapidly. Since input and output of data take place in synchronization with the clock signal, the access speed of data corresponds to the clock signal, so that fast data transmission is allowed.

In this SDRAM, continuous bits (e.g., eight bits per data I/O terminal) are continuously accessed in synchronization with the clock signal in order to achieve fast access.

FIG. 37 is a timing chart showing an operation for data reading in an SDRAM. In the SDRAM, operation modes are determined by combinations of states of external control signals /RAS, /CAS and /WE at rising edges of an external clock signal extCLK. The combinations of the states of the external control signals are generally called commands. Signal /RAS is a row address strobe signal, and signal /CAS is a column address strobe signal. Signal /WE is a write enable signal.

In a clock cycle #1 of external clock signal extCLK (which will be merely called a "clock cycle" hereinafter) in FIG. 37, row address strobe signal /RAS is set to L-level, and column address strobe signal /CAS and write enable signal /WE are both set to H-level at a rising edge of external clock signal extCLK. The combination of these states of signals /RAS, /CAS and /WE is called an "active command", which instructs start of the memory cycle in the SDRAM. When this active command is applied, the device takes in a currently applied address signal Add as a row address signal Xa, and internally performs a row select operation. When a delay time tRCD, which is generally called an RAS-CAS delay time in a standard DRAM, elapses after the application of this active command, a command for column selection is applied.

More specifically, at the rising edge of external clock signal extCLK in a clock cycle #4, row address strobe signal /RAS and write enable signal /WE are set to H-level, and column address strobe signal /CAS is set to L-level. The combination of these states of signals /RAS, /CAS and /WE is called a "read command", which instructs a data read operation together with the column selection. When this read command is applied, the device takes in currently applied address signal Add as a column address signal Yb, and performs the column selection. A certain time is required till data in a selected memory cell reaches an output circuit for outputting the data. When this time elapses, first data q0 is fixed at the rising edge of external clock signal extCLK in a clock cycle #7. Thereafter, read data q1–q7 are made definite at rising edges of external clock signal extCLK in clock cycles #8–#14, respectively.

Addresses of data q0–q7 are automatically generated in the SDRAM with column address signal Yb as a leading address. (The addresses generated in this manner are called burst addresses.) The number of cycles of external clock signal extCLK from application of the read command to first output of valid data is called a CAS latency. In FIG. 37, the CAS latency is 3.

The number of bits of data (per one data I/O terminal) which are read continuously in response to one read command is called a burst length. FIG. 37 shows a data read sequence in the case where the burst length is 8. In the SDRAM, the CAS latency and the burst length can be changed by data set in a mode register.

FIG. 38 shows a data write sequence of the SDRAM. A data write operation will be described below with reference to FIG. 38.

In clock cycle #1, and particularly at the rising edge of external clock signal extCLK, signal /RAS is set to L-level, and signals /CAS and /WE are both set to H-level. Thereby, the active command is applied, and the device takes in the currently supplied address signal Add as a row address signal Xc and internally performs the row select operation.

At the rising edge of external clock signal extCLK in clock cycle #4, row address strobe signal /RAS is set to H-level, and column address strobe signal /CAS and write enable signal /WE are both set to L-level. The combination of these states of signals /RAS, /CAS and /WE is called a "write command", which instructs data writing together with the column selection. When this write command is applied, the device takes in currently applied address signal Add as column address signal Yd, and internally performs the column selecting operation.

In the data write operation, the CAS latency is not required, and the device starts take-in of external write data in clock cycle #4. More specifically, in clock cycle #4 in which the write command is applied, the device takes in data d0 in synchronization with the rising of external clock signal extCLK, and applied write data d1–d7 are successively taken in at the rising edges of external clock signal extCLK in subsequent clock cycles #5–#11, respectively. These data d0–d7 are internally written into selected memory cells in accordance with a predetermined sequence, respectively.

During this data writing, take-in of data starts from the clock cycle in which the write command is applied. Actual writing into the selected memory cell is slightly delayed as will be described later (because a time is required for data transmission through a write path from an input buffer stage to the selected memory cell). As shown in FIGS. 37 and 38, write/read of data are performed in synchronization with external clock signal extCLK, and therefore input/output of data can be performed in synchronization with, e.g., the system clock determining the operation speed of the microprocessor, so that fast access is allowed.

In the SDRAM, transmission of internal data is performed in synchronization with the clock signal (i.e., internal clock signal produced from the external clock signal). A 2-bit prefetch method and a pipeline method have been known architectures for implementing the above SDRAM. These methods will be described below.

FIG. 39 schematically shows a structure of a portion related to one data I/O terminal in an SDRAM employing the 2-bit prefetch method. The structure shown in FIG. 39 is provided corresponding to each of data I/O terminals.

In FIG. 39, the SDRAM includes memory arrays 1aa, 1ab, 1ba and 1bb each having a plurality of memory cells arranged in rows and columns. The SDRAM has two banks A and B. Memory arrays 1aa and 1ab form bank A, and memory arrays 1ba and 1bb form bank B. In banks A and B, memory array 1aa forms a subbank A0, memory array 1ab forms a subbank A1, memory array 1ba form a subbank B0 and memory array 1bb forms a subbank B1. In the 2-bit prefetch method, this SDRAM functions as 2-bank SDRAM. Banks A and B can be driven to the active and inactive states independently of each other. Designation of the bank is performed by a bank address which is applied simultaneously with a command.

For memory array 1aa, there are arranged an X-decoder group 2aa which is made active when a bank address signal Bx is active, and decodes row address signal (bits) X0–Xj (X0–j) to drive an addressed row in memory array 1aa to the selected state, a sense amplifier group 3aa which is made active when a sense amplifier activating signal φSAA is active, to sense, amplify and latch data in the memory cells connected to the selected row in memory array 1aa, and a Y-decoder group 4aa which is made active when a bank address signal BY is active, and decodes column address signal (bits) YE0–YEk (YE0–k) to select an addressed column in memory array 1aa. The memory cell on the column selected by Y-decoder group 4aa is coupled to an internal data bus 5aa. Bank address signal BX is a bank address signal which is applied simultaneously with the active command or a precharge command instructing return to the precharge state. Bank address signal BY is a bank address signal which is applied simultaneously with the read command or the write command.

For memory array 1ab, there are arranged an X-decoder group 2ab which is made active when bank address signal BX is active, and decodes row address signal X0–Xj to drive an addressed row (word line) in memory array 1ab to the selected state, a sense amplifier group 3ab which is made active when sense amplifier activating signal φSAA is active, to sense and amplify data of the memory cells in the selected row in memory array 1ab, and a Y-decoder group 4ab which is made active when bank address signal BY is active, and decodes column address signal YO0–YOk to select an addressed column in memory array 1ab. The memory cell on the column selected by Y-decoder group 4ab is coupled to internal data bus 5ab.

For memory array 1ba, there are arranged an X-decoder group 2ba which is made active when a bank address signal /BX is active, and decodes address signal X0–Xj to drive the addressed row in memory array 1ba to the selected state, a sense amplifier group 3ba which is made active when sense amplifier activating signal φSAB is active, to sense, amplify and latch the data of memory cells connected to the selected row in memory array 1ba, and Y-decoder group 4ba which is made active when a bank address signal /BY is active, and selects an addressed column in memory array 1ba. Bank address signal /BX is complementary to bank address signal BX. Bank address signal /BY is complementary to bank address signal BY. The memory cell on the column in memory array 1ba selected by Y-decoder group 4ba is coupled to internal data bus 5ba.

For memory array 1bb, there are arranged an X-decoder group 2bb which is made active when bank address signal /BX is active, and decodes row address bits X0–Xj to drive the addressed row in the memory array 1bb to the selected state, a sense amplifier group 3bb which is made active when sense amplifier activating signal φSAB is active, to sense, amplify and latch the data of memory cells on the selected row in memory array 1bb, and a Y-decoder group 4bb which is made active when bank address signal /BY is active, and decodes column address signal YO0–YOk to select the addressed column in memory array 1bb. The memory cell on the column selected by Y-decoder group 4bb is coupled to internal data bus 5bb.

The X-decoder groups, sense amplifier groups and Y-decoder groups described above each have the name of "group", because the X-decoder group includes X-decoders arranged corresponding to the rows, respectively, the sense amplifier group has sense amplifiers arranged corresponding to the columns in the corresponding memory array, respectively, and the Y-decoder group includes Y-decoders arranged corresponding to the columns, respectively.

In memory arrays 1aa and 1ab, selection of the memory cells is concurrently performed in accordance with bank address signals BX and BY, respectively. In memory arrays 1ba and 1bb, selection is concurrently performed in accordance with bank address signals /BX and /BY, respectively.

For writing data into memory arrays 1aa and 1ab, there are provided an input buffer 7a which is coupled to a data I/O terminal 6, and is activated in accordance with activation of an input buffer activating signal φDBA to take in data supplied from data I/O terminal 6, a selector 8a for selecting paths for transferring write data applied from input buffer 7a in accordance with a select signal φSEA, a write register 9aa which stores data applied from selector 8a in response to activation of a register activating signal φRWA0, a write register 9ab which is provided for memory array 1ab, and takes in and latches data applied from selector 8a when register activating signal φRWA1 is active, a write buffer 10aa which is provided corresponding to memory array 1aa, and is activated to amplify write data from write register 9aa for transmission onto internal data bus 5aa when write buffer activating signal φWBA0 is active, and a write buffer 10ab which is provided corresponding to memory array 1ab, and is activated to amplify data stored in write register 9ab for transmission onto internal data bus 5ab when write buffer activating signal φWBA1 is active. For internal data buses 5aa and 5ab, there is provided an equalize circuit 11a which is made active when equalize instructing signal φWEQA is active, and sets internal data buses 5aa and 5ab to a predetermined potential level.

For memory arrays 1ba and 1bb, there are likewise provided an input terminal 7b which is coupled to data I/O terminal 6, and successively takes in data from data I/O terminal 6 to produce internal write data when an input buffer activating signal φDBB is active, a selector 8b which selects data transfer paths from input buffer 7b in accordance with select signal φSAB, write registers 9ba and 9bb which store data transferred from selector 8b in accordance with register activating signals φRWB0 and φRWB1, respectively, and write buffers 10ba and 10bb which amplify data stored in write registers 9ba and 9bb for transmission onto internal data buses 5ba and 5bb when write buffer activating signals φWBB0 and φWBB1 are active, respectively. For internal data buses 5ba and 5bb, there is provided an equalize circuit 11b which is activated to equalize internal data buses 5ba and 5bb to a predetermined potential when equalize instructing signal φWEQB is active.

FIG. 40 schematically shows a structure of peripheral circuitry generating various internal signals shown in FIG. 39. In FIG. 40, the peripheral circuitry includes a control signal generating circuit 13 which takes in external control signals ext/RAS, ext/CAS, ext/OE and ext/WE, which are applied to input terminals 12a, 12b, 12c and 12d, respectively, in synchronization with rising of clock signal CLK, and generates internal control signals φxa, φya, φW, φO, φR and φC in accordance with the states of these external control signals, respectively. Signal ext/OE is an output enable signal. When signal ext/OE is active, the output buffer (not shown) is enabled. When output enable signal ext/OE is inactive, the output buffer is in an output high impedance state. Clock signal CLK is a clock signal which is internally produced in accordance with external clock signal extCLK.

A signal φxa is activated to instruct take-in of the row address signal when the active command is applied. Signal φya is activated when the read or write command is applied, and instructs take-in of the column address signal. Signal φW is activated when the write command is applied, and instructs data writing. Signal φO is activated when the read command is applied, and instructs data reading. Signal φR is activated when the active command is applied, and activates circuits related to the row selection. Signal φC is activated when the read or write command is applied, and activates column related circuits, i.e., circuits related to the column selection and data input/output.

The peripheral circuitry further includes an X-address buffer 14 which is responsive to activation of row address take-in instructing signal φxa for taking in external address signal extA0–Ai (A0–i) and generating internal row address signal (bits) X0–Xj (X0–j) and bank address signal BX, a Y-address buffer 15 which is activated to take in external address signal extA0–i and generate the internal column address signal when column address take-in instructing signal φya is active, and a Y-address operation circuit 16 which operates in synchronization with clock signal CLK to change the internal column address signal applied from Y-address buffer 15 in accordance with a predetermined sequence, with the internal column address signal as a leading address, and produces even-numbered column address signal YE0–YEk (YE0–k), odd-numbered column address signal YO0–YOk (YO0–k) and a bank address signal BY. This Y-address operation circuit 16 includes a burst address counter, and changes the column address signal every two clock cycles.

The peripheral circuitry further includes a clock counter 17 which counts internal clock signal CLK in accordance with activation of column-related activating signal φC, and generates a count-up signal at a predetermined timing in accordance with the counted value, and a control signal generating circuit 18 which receives the count-up signal of clock counter 17, bank address signals BX and BY, and lowest bit Y0 of the column address signal, and produces various internal control signals φWBB0, φWBB1, φWBA0, φWBA1, φRWB0, φRWB1, φφRWA0, φRWA1, φSEA, φSEB, φDBA, φDBB, φWEQA and φWEQB. In accordance with bank address signals BX and BY, the control signals for the designated bank are activated. The lowest column address signal bit Y0 is used for representing which one of the two memory arrays included in one bank is to be accessed first. Clock counter 17 includes a counter which counts the CAS latency and the burst length, and generates the count-up signal at a predetermined timing in accordance with the designated operation mode. A data write operation of the SDRAM shown in FIGS. 39 and 40 will be described below with reference to a timing chart of FIG. 41.

Before clock cycle #0 shown in FIG. 41, the active command is already applied, and certain rows are already driven to the selected state in memory arrays 1aa and 1ab shown in FIG. 39.

In clock cycle #0, column address strobe signal /CAS and write enable signal /WE are both set to L-level (while row address strobe signal /RAS is at H-level), and the write command is applied. Following assumptions are made. When this write command is applied, bank address BA designates bank A, bank address signal BX is activated, the lowest bit Y0 of address signal (Address) is 0, and memory array 1aa is designated. When the write command is applied, control signal generating circuit 40 shown in FIG. 40 drives column-related activating signal φC to the active state in accordance with the write command, and the clock counter 17 is activated. Y-address buffer 15 takes in the externally applied column address signal in accordance with column address take-in instructing signal φya, and Y-address operation circuit 16 generates internal address signals (bits) YE0–YEk and YO0–YOk. Control signal generating circuit 18 successively activates the control signals for bank A including memory arrays 1aa and 1ab in accordance with bank address signal BY and the lowest address bit Y0.

For memory arrays 1aa and 1ab, Y-decoder groups 4aa and 4ab are activated to decode applied internal column address signals YE0–YEk and YO0–YOk, and select the corresponding columns to connect them to internal data buses 5aa and 5ab, respectively.

The input buffer 7a is activated to take in externally applied write data D0. Selector 8a first stores internal write data in write register 9aa in accordance with the lowest address signal bit Y0. Therefore, data D0 applied in first clock cycle #0 is stored in write register 9aa. Write data D1 applied in next clock cycle #1 is stored in write register 9ab.

For a period from clock cycle #0 to clock cycle #1, write buffer activating signal φWBA0 is active, so that write buffer 10aa transmits write data onto internal data bus 5aa in accordance with data stored in write register 9aa. In clock cycle #1, write buffer 10ab is activated in accordance with write buffer activating signal φWBA1, and drives internal data bus 5ab in accordance with data stored in write register 9ab. After data of 2 bits is written into memory arrays 1aa and 1ab, write buffers 10aa and 10ab are deactivated, and equalize circuit 11a equalizes internal data buses 5aa and 5ab.

In a next clock cycle #2, values of column address signals YE0–YEk and YO0–YOk from Y-address operation circuit 16 shown in FIG. 40 are changed, so that different columns are selected. External write data D2 and D3 applied in clock cycles #2 and #3 are stored in write registers 9aa and 9ab in accordance with select signal φSEA, respectively. Then, write buffer 10aa is activated in response to activation of write buffer activating signal φWBA0, and transmits write data onto internal data bus 5aa. In subsequent clock cycle #3, write buffer 10ab is activated in response to activation of write buffer activating signal φWBA1, and transmits write data onto internal data bus 5ab. If the burst length is 4, data writing stops in accordance with the count-up signal from clock counter 17 after writing of four data D0–D3 is completed.

According to the data writing in this 2-bit prefetch method, both write buffers 10aa and 10ab are simultaneously made active, and two bits of data are simultaneously written in each of clock cycles #1 and #3. Y-decoder groups 4aa and 4ab are supplied with the same column address signal, and simultaneously perform the column select operation. Therefore, two clock cycles can be utilized for an operation from column selection to data writing. In memory array 1ab, data D1 which is externally applied in clock cycle #1 is transmitted onto the selected column of memory array 1ab in the same clock cycle #1. However, the column select operation has started in clock cycle #0, and two clock cycles can be utilized for an operation from the column selection to the actual data writing. Therefore, even in the case that external clock signal extCLK has a high frequency and a fast operation is performed, data writing can be performed with a sufficient margin.

FIG. 42 shows a structure of a data writing portion in an SDRAM of a pipelined type. FIG. 42 shows a structure of a portion related to data writing of 1 bit. Similarly to the SDRAM shown in FIG. 39, the SDRAM shown in FIG. 42 includes four memory arrays 1aa, 1ab, 1ba and 1bb. Memory arrays 1aa and 1ab form bank A, and memory arrays 1ba and 1bb form bank B. Similarly to the structure shown in FIG. 39, X-decoder groups 2aa, 2ab, 2ba and 2bb, sense amplifier groups 3aa, 3ab, 3ba and 3bb, and Y-decoder groups 4aa, 4ab, 4ba and 4bb are provided for memory arrays 1aa, 1ab, 1ba and 1bb, respectively. These structures are the same as those in the SDRAM of the 2-bit prefetch type shown in FIG. 39.

For writing data into bank A, there are provided an input buffer 7a which is coupled to data I/O terminal 6 and takes in applied data in response to activation of input buffer activating signal φDBA, a write register 9a which takes in and latches data applied from input buffer 7a in response to activation of register activating signal φRWA, and a write buffer 10a which amplifies the data applied from write register 9a for transmission onto internal data bus 5a in response to activation of write buffer activating signal φWBA. Internal data bus 5a is provided commonly for memory arrays 1aa and 1ab.

For bank B, there are provided an input buffer 7b which is coupled to data I/O terminal 6 and takes in applied data in response to activation of input buffer activating signal φDBA, a write register 9b which takes in and latches data applied from input buffer 7b in response to activation of register activating signal φRWB, and a write buffer 10b which amplifies the data stored in write register 9b for transmission onto internal data bus 5b in response to activation of write buffer activating signal φWBB. Internal data bus 5b is provided commonly for memory arrays 1ba and 1bb.

FIG. 43 schematically shows a structure of an internal signal generating portion in the SDRAM of the pipelined type shown in FIG. 42. An internal control signal generating circuit shown in FIG. 43 differs from the internal control signal generating circuit shown in FIG. 40 in a Y-address operation circuit 26 which generates internal column address signals YE0–YEk and YO0–YOk as well as bank address signal BY, and a control signal generating circuit 28 generating internal data write and transfer control signals. Y-address operation circuit 26 alternately activates even-numbered column address signal YE0–YEk and odd-numbered column address signal YO0–YOk every clock cycle.

Control signal generating circuit 28 operates in accordance with bank address signals BX and BY, and activates the control signals applied to the selected bank in accordance with a predetermined sequence. Selection of the memory cell for data writing is performed by internal column address signals YE0–YEk and YO0–YOk from Y-address operation circuit 26. The internal column address signals are alternately activated every clock cycle. Data write operation of the SDRAM of the pipelined type shown in FIGS. 42 and 43 will be described below with reference to a timing chart of FIG. 44.

Column address strobe signal /CAS and write enable signal /WE are set to L-level at the rising edge of external clock signal extCLK in clock cycle #1, and the write command is applied. Simultaneously with this write command, bank address signal BA is applied, and memory bank A (memory arrays 1aa and 1ab) is designated. At the same time, an even-numbered address is designated by externally applied address signal Address. Input buffer 7a is activated in accordance with activation of input buffer activating signal φDBA, and takes in data D0, which is applied to data I/O terminal 6 for transference to write register 9a. Write register 9a takes in applied data in response to activation of register activating signal φRWA, and is set to the latching state in response to deactivation of the signal φRWA. When write register 9a attains the latching state, write buffer activating signal φWBA is then activated, and write buffer 10a amplifies the data latched in write register 9a for transmission onto internal data bus 5a.

In memory array 1aa, Y-decoder group 4aa performs the column selection in accordance with internal column address signal YE0–YEk from Y-address operation circuit 26, and couples the selected column to internal data bus 5a. Thereby, data D0 is written into the selected memory cell in memory array 1aa. In parallel with this data writing, data D1 applied in the next clock cycle #2 is transferred and taken into write register 9a via input buffer 7a. Write register 9a is not yet in the latching state, and does not apply this data to write buffer 10a yet.

In clock cycle #2, Y-decoder group 4ab performs column selection in memory array 1ab, and the column thus selected is coupled to internal data bus 5a in accordance with internal column address signal YO0–YOk.

When write register 9a attains the latching state, write buffer 10a is activated again in response to activation of write buffer activating signal φWBA, and transmits write data onto internal data bus 5a to write the data into the selected column (represented by CSL) in memory array 1ab. Thereby, data D1 is written into memory array 1ab.

Data D2 and D3 applied in following clock cycles #3 and #4 are successively written respectively into the selected columns in memory arrays 1aa and 1ab through input buffer 7a, write register 9a and write buffer 10a.

A write register 9a for latching data is arranged between input buffer 7a and write buffer 10a. In parallel with data writing into the memory array by write buffer 10a, write data can be transferred from input buffer 7a to write register 9a. Even in the case that a long time is required for transferring data from input buffer 7a to write buffer 10a, therefore, transfer of write data can be performed utilizing a time for data writing by the write buffer, so that the data transfer time can be effectively hidden by this data writing time, and fast data transfer is allowed.

In the SDRAM of this pipelined type, however, the column select operations in memory arrays 1aa and 1ab must be alternately performed every clock cycle, if bank A is selected. If bank B is designated, the operations are alternately performed in memory arrays 1ba and 1bb. Therefore, only one cycle can be utilized for operations from the column selection to writing of data into the selected column, resulting in such disadvantages that data cannot be written with a sufficient margin if external clock signal extCLK is fast, and the operation frequency cannot be increased as compared with the 2-bit prefetch type.

The SDRAM of the pipelined type internally performs the data transfer in a pipelined manner, and efficiently utilizes the clock cycle for performing data writing. In this SDRAM of the pipelined type, however, it is necessary to select and couple the column to the write buffer at each clock cycle. If the clock cycle is short, therefore, there is no time margin for connecting the selected column to the write buffer. Therefore, this SDRAM is not suitable to a fast operation (because internal data bus lines, i.e., local I/O bus is equalized after completion of writing of 1-bit data). In this SDRAM of the pipelined type, however, only one of the memory cell columns is selected in each clock cycle, and only one write buffer (per one I/O terminal) is activated, so that the power consumption is advantageously small. Therefore, the SDRAM of the pipelined type is used in a system using a low-speed clock signal CLK of, e.g., 66 MHz.

In the SDRAM of the prefetch type, two bits are prefetched, and memory cell data is written into the selected column during two clock cycles. Therefore, two clock cycles can be utilized for operations from the column selection to the connection of the selected column to the write buffer, and data writing can be performed with a sufficient margin even if the clock cycle is short. In the SDRAM of this 2-bit prefetch type, however, column selection is performed simultaneously in two memory arrays, and two write buffers are simultaneously activated, so that a current consumption is large. Therefore, in the case that this SDRAM of the 2-bit prefetch type is used in a system using a slow clock, a period of the clock cycle is long, and therefore the internal data bus is driven to the potential level corresponding to the write data for a long period, resulting in increase in current consumption. Accordingly, the SDRAM of the 2-bit prefetch type is used in a system performing a fast operation, e.g., at 100 MHz or 200 MHz.

The SDRAMs of the pipelined type and the 2-bit prefetch type have different internal structures, and therefore employ different chip structures. This results in increase in number of the types of products and complicated management by a manufacturer.

For overcoming the above problem, a structure, in which one of the pipelined type and the 2-bit prefetch type is selected by a bonding option in accordance with a data bit width, has been disclosed, for example, in "2.5 ns clock access 250 MHz 256 Mbits SDRAM having a synchronous mirror delay" by Saeki et al., in a lecture No. P23 in Transactions of ISSCC 96. Another structure in which one of a 2-bit prefetch type and a pipeline write type is selected by a bonding pad is also disclosed in Japanese Patent Laying-Open No. 7-169263 (1995).

According to the structure, in which the pipelined type and the 2-bit prefetch type are selectively employed by the bonding option, the same chip internal structure can be employed, and the chips of the same structure can be used to form selectively the SDRAM of the prefetch type and the SDRAM of the pipelined type in the final stage.

In this case, however, the data transfer method is set by the bonding option, and the data transfer type of the product, i.e., SDRAM is fixed to either the 2-bit prefetch type or the pipelined type. Therefore, a user selects either the SDRAM of the 2-bit prefetch type or the SDRAM of the pipelined type in accordance with the system application. However, if it becomes necessary to change the clock speed, for example, due to change in system specifications to be actually used, the SDRAM must be entirely changed in accordance with the specification change, so that the specifications cannot be changed easily.

Even in the case that change in clock speed due to, e.g., change in system specifications is not required, a user must select the SDRAMs in accordance with the intended clock speed, and therefore must accurately manage the purchased products at much expense in time and effort. If a pipelined SDRAM of a low-speed version is used in a high-speed system, it may be impossible to construct a processing system which can operate accurately. Therefore, a user must always recognize the product types of SDRAMs to be used in accordance with the processing system speed, and therefore must exercise extra care in using the products.

SUMMARY OF THE INVENTION

An object of the invention is to provide an SDRAM which allows easy adjustment of an internal data transfer mode in accordance with a clock to be used.

Another object of the invention is to provide an SDRAM in which an internal data transfer mode can be easily set in accordance with an operation environment for use without an awareness by a user.

Yet another object of the invention is provide an SDRAM which is user-friendly, and allows easy management by a manufacturer.

Briefly, a synchronous semiconductor memory device according to the invention has a structure, in which a write data transfer method can be set to either a pipelined mode or a multibit prefetch mode in accordance with data stored in a mode register storing data designating an operation mode of the synchronous semiconductor memory device.

A synchronous semiconductor memory device according to the invention includes a memory array having a plurality of memory cells, an internal clock generating circuit for receiving an externally applied external clock signal, and generating an internal clock signal determining a data write cycle in synchronization with the external clock signal, and a data write circuit for writing data into a selected memory cell in the memory array in synchronization with the internal clock signal during data writing. The data write circuit is operable in a pipelined mode for writing different data into the different memory cells every cycle of the internal clock signal and a prefetch mode for writing different data into the plurality of memory cells every multiple cycles of the internal clock signal.

The synchronous semiconductor memory device according to the invention further includes a mode register for storing data related to an operation speed of the semiconductor memory device, and a mode setting circuit for setting the operation mode of the data write circuit to either the pipelined mode or the prefetch mode.

In accordance with the data related to the operation speed stored in the mode register, the mode setting circuit sets the operation mode of the data write circuit. The data related to the operation speed is, for example, CAS latency data or data input/output rate data, which must be necessarily set in the mode register by a user for using the device.

Therefore, the user can operate the data write circuit in an optimum operation mode in accordance with an operation speed of the synchronous semiconductor memory device without awareness of the operation mode of the data write circuit. Therefore, the user can utilize the synchronous semiconductor memory device without awareness of the operation mode of the data write circuit, and the operation mode of the data write circuit is selected in accordance with the operation mode, so that chips of only one type are required, which facilitates product management.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows a structure of a memory array in a semiconductor memory device according to an embodiment 1 of the invention;

DESCRIPTION OF THE PREFERRED EMBODIMENTS

Embodiment 1

Figure 2:
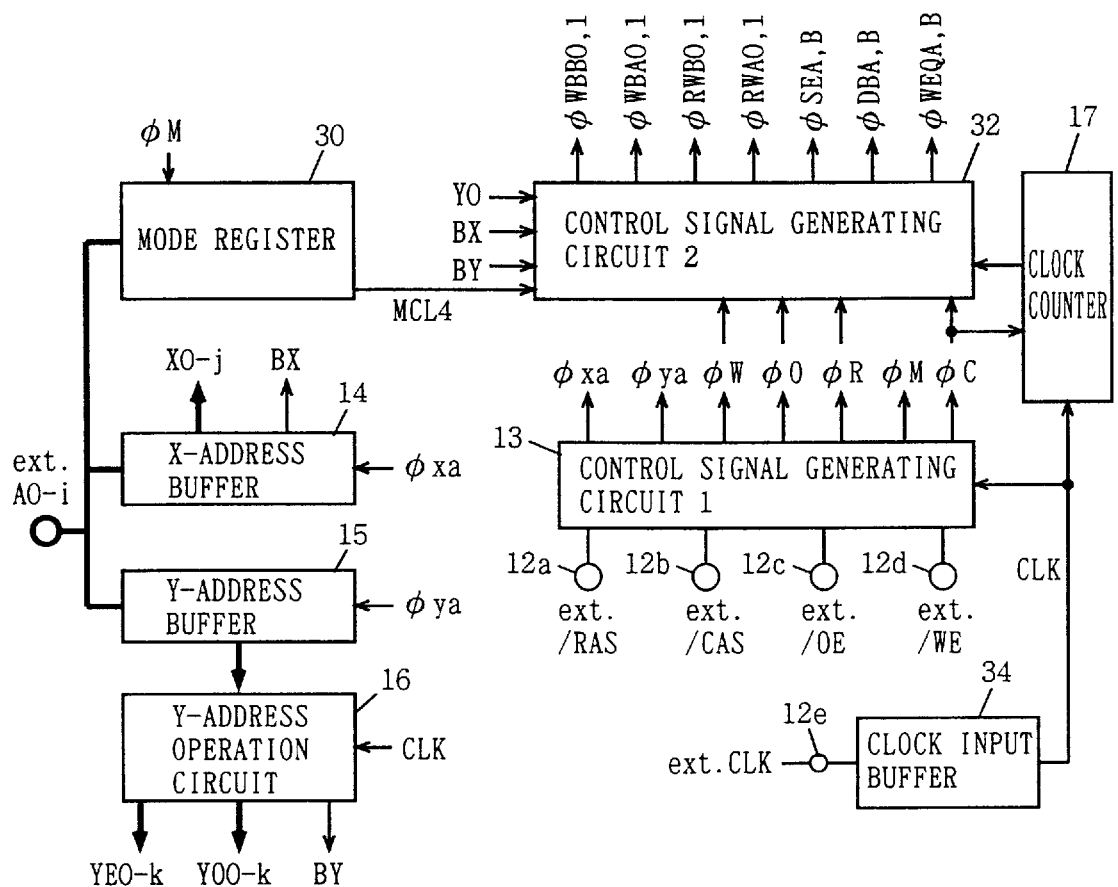
FIG. 2 schematically shows a structure of peripheral circuitry of the semiconductor memory device according to the embodiment 1 of the invention.

FIG. 1 schematically shows a structure of a portion related to writing of data of 1 bit in an SDRAM according to an embodiment 1 of the invention. The structure shown in FIG. 1 is provided corresponding to each of data input/output terminals.

In FIG. 1, the SDRAM includes memory arrays 1*aa*, 1*ab*, 1*ba* and 1*bb*, each of which includes a plurality of dynamic memory cells arranged in rows and columns. For memory array 1*aa*, there are provided X-decoder group 2*aa* which is made active when bank address signal BX is active, and decodes internal row address signal (bits) X0–Xj (X0–j) to drive the addressed row (word line) in memory array 1*aa* to the selected state, sense amplifier group 3*aa* which is activated in response to activation of sense amplifier activating signal φSAA, to sense, amplify and latch data of the memory cells connected to the selected row in memory array 1*aa*, and Y-decoder group 4*aa* which is made active when bank address signal BY is active, and decodes internal column address signal YE0–YEk to select the addressed column in memory array 1*aa*.

The memory cell on the column selected in memory array 1*aa* is coupled to internal data bus 5*aa*. X-decoder group 2*aa* includes X-decoders provided corresponding to the rows (word lines) in the memory array, respectively. Sense amplifier group 3*aa* includes sense amplifiers provided corresponding to the columns (bit line pairs) in memory array 1*aa*. Y-decoder group 4*aa* includes Y-decoders provided corresponding to the columns in memory array 1*aa*. The terms "group" in the following description represent the same meaning as those in the previous description.

For memory array 1*ab*, there are provided X-decoder group 2*ab* which is made active when bank address signal BX is active, and decodes internal row address signal X0–Xj to drive the addressed row in memory array 1*ab* to the selected state, sense amplifier group 3*ab* which is made active when sense amplifier activating signal φSAA is active, to sense, amplify and latch data of the memory cells connected to the selected row in memory array 1*ab*, and Y-decoder group 4*aa* which is made active when bank address signal BY is active, and selects the addressed column in memory array 1*ab*.

The memory cell on the column selected by Y-decoder group 4*ab* in memory array 1*ab* is coupled to internal data bus 5*ab*. Internal data bus 5*ab* is provided separatedly from internal data bus 5*aa* provided for memory array 1*aa*.

For memory array 1*ba*, there are provided X-decoder group 2*ba* which is made active when bank address signal BX is active, and decodes internal row address signal X0–Xj to drive the addressed row in memory array 1*ba* to the selected state, sense amplifier group 3*ba* which is made active when sense amplifier activating signal φSAB is active, to sense, amplify and latch data of the memory cells connected to the selected row in memory array 1*ba*, and Y-decoder group 4*ba* which is made active when bank address signal /BY is active, and decodes internal column address signal YE0–YEk to select the addressed column in memory array 1*ba*. The memory cell on the column selected by Y-decoder group 4*ba* in memory array 1*ba* is coupled to internal data bus 5*ba*.

For memory array 1*bb*, there are provided X-decoder group 2*bb* which is made active when bank address signal /BX is active, and decodes internal row address signal X0–Xj to drive the addressed row in memory array 1*bb* to the selected state, sense amplifier group 3*bb* which is activated in response to activation of sense amplifier activating signal φSAB, to sense, amplify and latch data of the memory cells connected to the selected row in memory array 1*bb*, and Y-decoder group 4*bb* which is made active when address signal /BY is active, and decodes internal column address signal YE0–YEk to select the addressed column in memory array 1*bb*. The memory cell on the column selected by Y-decoder group 4*bb* in memory array 1*bb* is coupled to internal data bus 5*bb*. Internal data bus 5*bb* is provided independently of internal data bus 5*ba* provided for memory array 1*ba*.

Owing to provision of the X-decoder group and Y-decoder group for each of memory arrays 1*aa*, 1*ab*, 1*ba* and 1*bb*, memory arrays can be driven to the selected state independently of each other, and the banks can be implemented.

In the structure shown in FIG. 1, memory arrays 1*aa* and 1*ab* form bank A to be selected by bank address signals BX and BY, and memory arrays 1*ba* and 1*bb* form bank B which is driven to the active state in accordance with activation of bank address signals /BX and /BY. Memory array 1*aa* forms a subbank A0 in bank A, and memory array 1*ab* forms a subbank A1 in bank A. Memory array 1*ba* forms a subbank B0 in bank B, and memory array 1*bb* forms a subbank B1 in bank B. Therefore, the SDRAM shown in FIG. 1 can achieve up to four bank structures. The following description will be given on an SDRAM of 2-bank structure using bank address signals BX and /BX as well as bank signals BY and /BY.

For writing data into bank A, there are provided input buffer 7*a* which is coupled to data I/O terminal 6, and is enabled in response to activation of input buffer activating signal φDBA to take in data DQi supplied to data I/O terminal 6 and produce internal write data, selector 8*a* for selecting transfer paths for transferring data applied from input buffer 7*a* in accordance with select signal φSEA, write register 9*aa* which takes in and latches data applied from selector 8*a* in response to activation of register activating signal φRWA0, write register 9*ab* which takes in and latches data transmitted from selector 8*a* in response to activation of register activating signal φRWA1, write buffer 10*aa* which is activated in response to activation of write buffer activating signal #WBA0 to amplify data from write register 9*aa* for transmission onto internal data bus 5*aa*, and write buffer 10*ab* which is activated in response to activation of write buffer activating signal φWBA1 to amplify data applied from write register 9*ab* for transmission onto internal data bus 5*ab*. For internal data buses 5*aa* and 5*ab*, there is provided equalize circuit 11*a* which is made active when equalize instructing signal φWEQA is active, and sets internal data buses 5*aa* and 5*ab* to a predetermined potential. For internal data buses 5*ba* and 5*bb*, there is likewise provided equalize circuit 11*b* which is made active when equalize instructing signal φWEQB is active, and sets internal data buses 5*ba* and 5*bb* to a predetermined potential.

Figure 39:
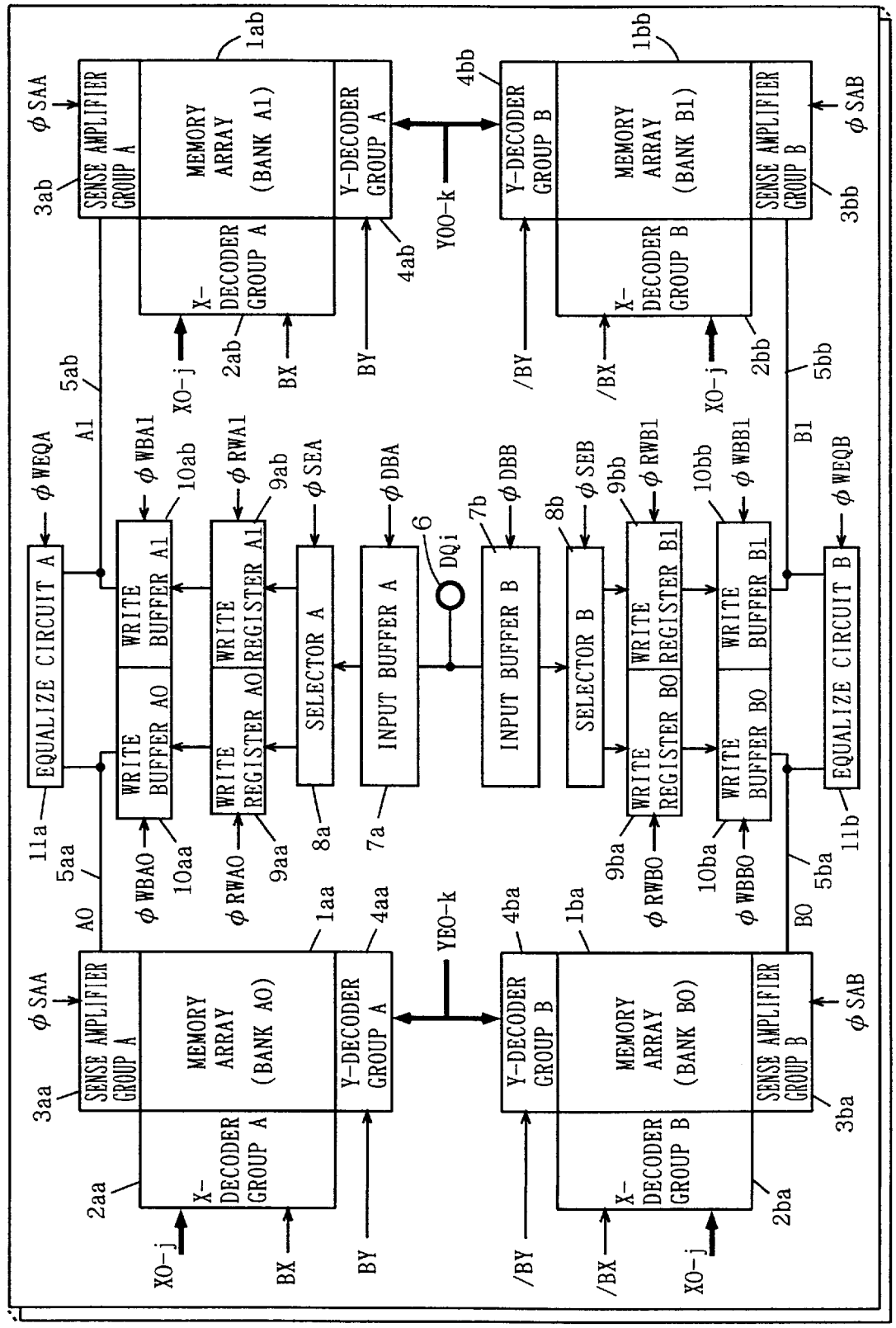
FIG. 39 conceptually shows a structure of an array in a synchronous semiconductor memory device of a 2-bit prefetch type in the prior art.
Figure 40:
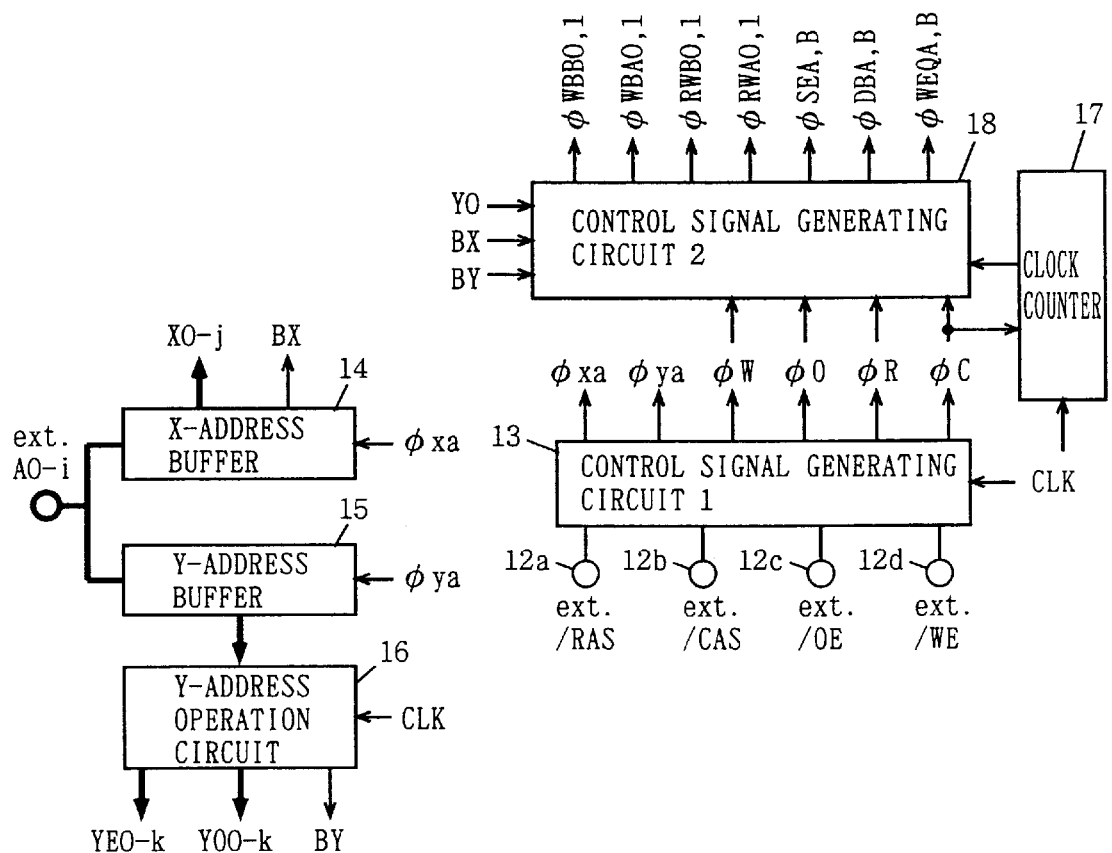
FIG. 40 schematically shows a structure of peripheral circuitry in the synchronous semiconductor memory device of the 2-bit prefetch type in the prior art.
Figure 41:
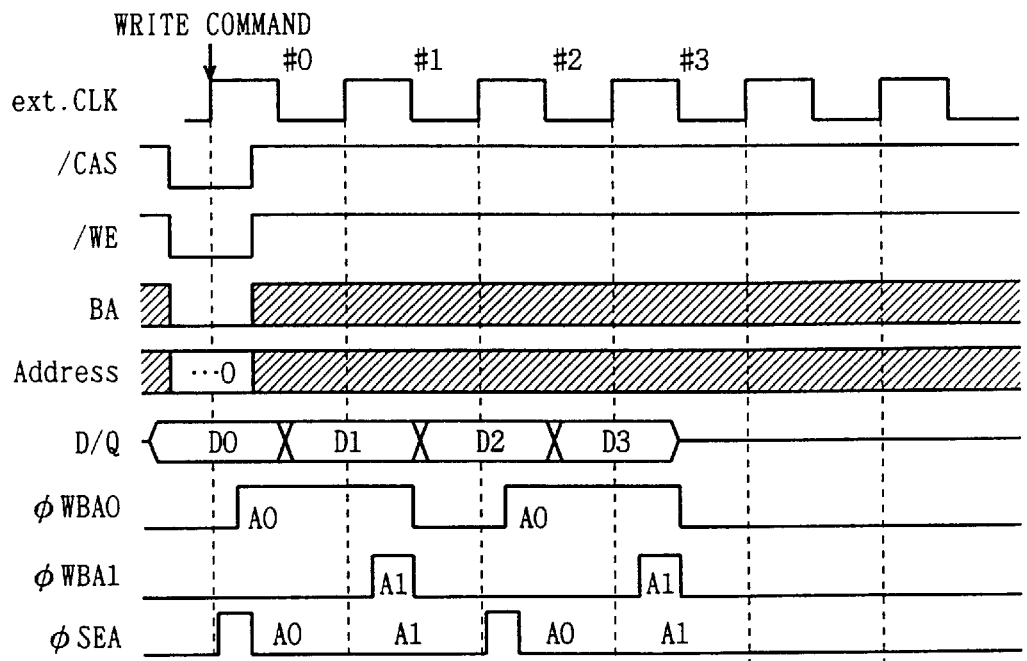
FIG. 41 is a timing chart representing a data write operation of the semiconductor memory device shown in FIGS. 39 and 40.
Figure 42:
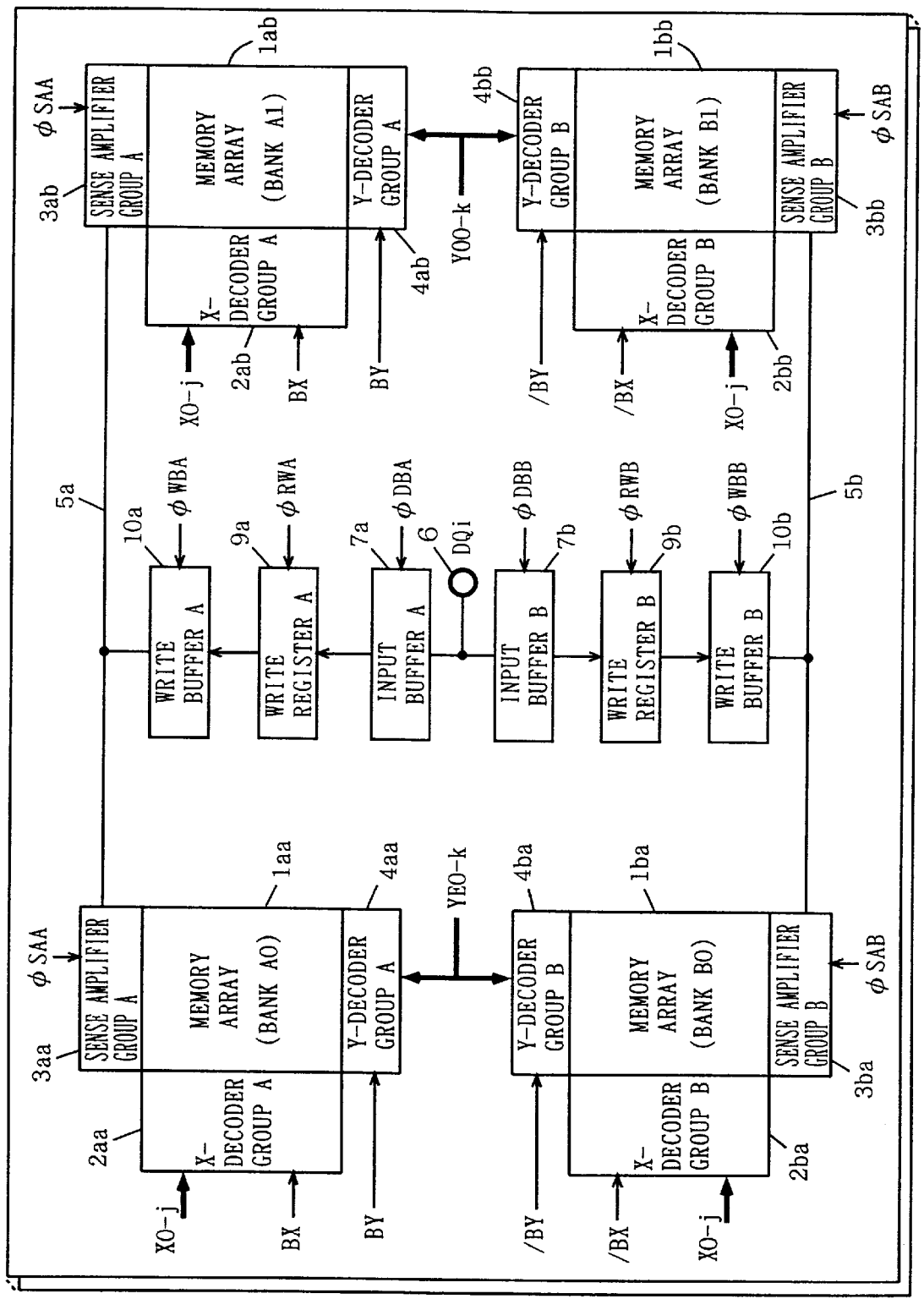
FIG. 42 schematically shows a structure of an array of a synchronous semiconductor memory device of a pipelined type in the prior art.
Figure 43:
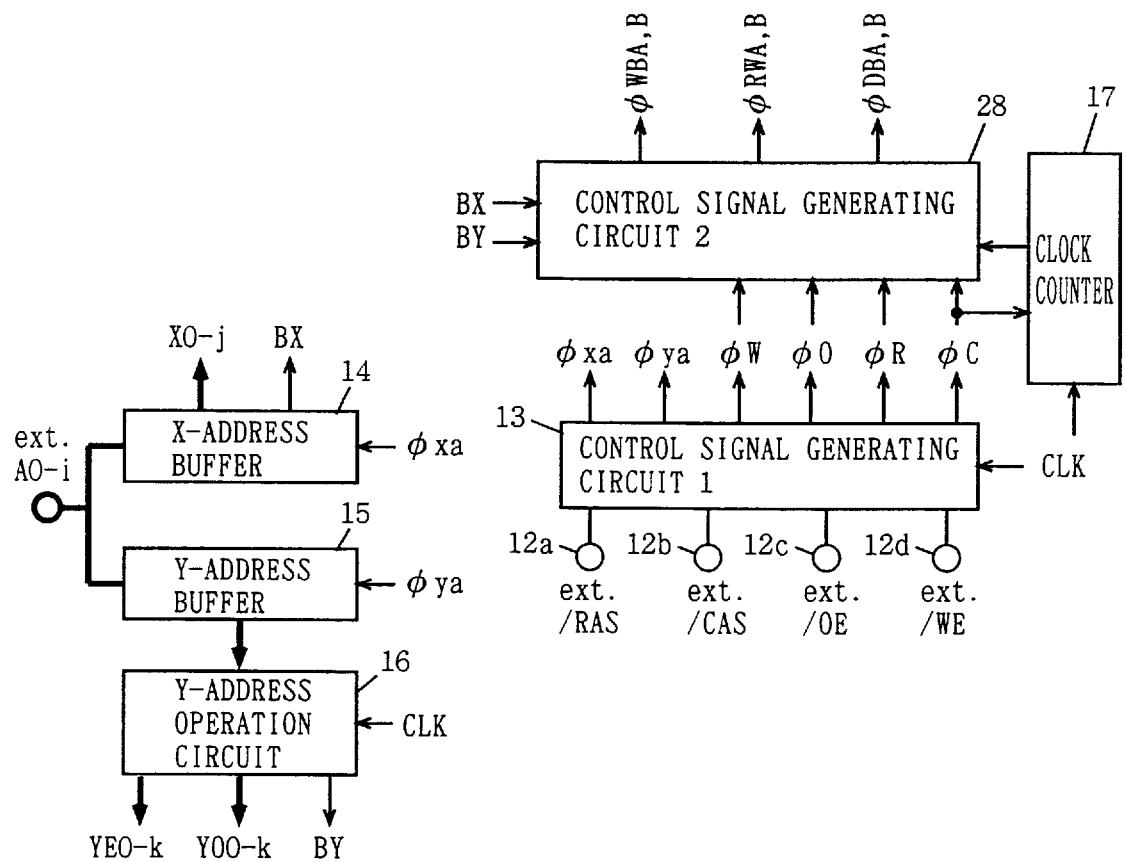
FIG. 43 schematically shows a structure of peripheral circuitry of the synchronous semiconductor memory device of the pipelined type in the prior art.
Figure 44:
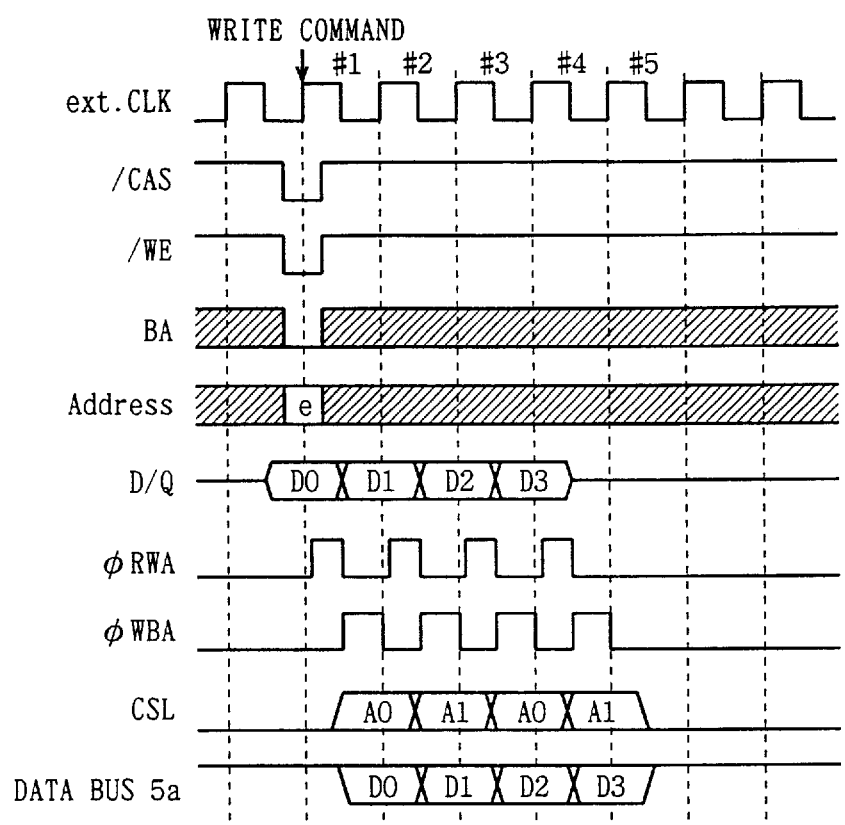
FIG. 44 is a timing chart representing an operation of the synchronous semiconductor memory device shown in FIGS. 42 and 43.

The structure of the SDRAM shown in FIG. 1 is the same as that of the SDRAM of the 2-bit prefetch type shown in FIG. 39. Sequences of generating control signals for write data transfer are selected in accordance with data transfer modes. Thereby, the same structure can be used to implement the SDRAM of the pipelined type and the SDRAM of the 2-bit prefetch type.

FIG. 2 schematically shows a structure of peripheral circuitry generating internal signals in the SDRAM shown in FIG. 1. In FIG. 2, the peripheral circuitry includes control signal generating circuit 13 which takes in external control signals ext/RAS, ext/CAS, ext/OE and ext/WE, which are applied to input terminals 12a, 12b, 12c and 12d, respectively, in synchronization with rising of internal clock signal CLK, and produces internal control signals corresponding to the designated command by determining the states of the received external control signals, X-address buffer 14 responsive to activation of row address take-in instructing signal $\phi$xa from control signal generating circuit 13 for taking in external address signal extA0–Ai (A0–i) and generating internal row address signal X0–Xj and bank address signal BX, Y-address buffer 15 which takes in external address signal extA0–Ai in response to activation of column address take-in instructing signal $\phi$ya from control signal generating circuit 13, and generates the internal column address signals, and Y-address operation circuit 16 which operates in synchronization with rising of internal clock signal CLK and produces internal column address signal YE0–YEk and YO0–YOk as well as bank address signal BY.

Y-address operation circuit 16 includes a burst address counter, of which structure will be described later, and changes the internal column address signals YE0–YEk and YO0–YO0 every two clock cycles in accordance with a predetermined sequence with the internal column address signal applied from Y-address buffer 15 as a leading address. X-address buffer 14 and Y-address buffer 15 have the same structures as those in the SDRAM shown in FIG. 39. Internal clock signal CLK is produced from a clock input buffer 34 which receives external clock signal extCLK applied to a clock input terminal 12e. Clock input buffer 34 produces a pulse signal having a predetermined time width in synchronization with rising of external clock signal extCLK, and generates the same as internal clock signal CLK.

The peripheral circuitry further includes a mode register 30 responsive to activation of a mode register set instructing signal $\phi$M from control signal generating circuit 13 for taking in predetermined bits of the external address signal and producing data such as CAS latency data and burst length data. In the CAS latency data stored in mode register 30, a signal MCL4 representing the CAS latency of 4 is used for selecting the data transfer modes in the SDRAM.

The peripheral circuitry further includes clock counter 17 which counts internal clock signal CLK in response to activation of column-related activating signal $\phi$C from control signal generating circuit 13, and generates a count-up signal at a predetermined timing, and a control signal generating circuit 32 which generates internal data write transfer control signals $\phi$WBB0, $\phi$WBB1, $\phi$WBA0, $\phi$WBA1, $\phi$RWB0, $\phi$RWB1, $\phi$RWA0, $\phi$RWA1, $\phi$SEA, $\phi$SEB, $\phi$DBA, $\phi$DBB, $\phi$WEQA and $\phi$WEQB in accordance with control signals $\phi$W, $\phi$O, $\phi$R and $\phi$C applied from control signal generating circuit 13 in accordance with CAS latency 4 designating signal MCL4 from mode register 30, bank address signals BX and BY, and internal lowest column address signal bit Y0. Control signal generating circuit 32 selects the control signal generating sequence in accordance with latency designating signal (flag) MCL 4 indicating whether the CAS latency stored in mode register 30 is 4 or not.

Control signals $\phi$W, $\phi$O, $\phi$R and $\phi$C generated from control signal generating circuit 13 are the same as those from control signal generating circuit 13 already described and shown in FIG. 39. Signal $\phi$W is activated when the write command is applied. Signal $\phi$O is activated when the read command is applied. Signal $\phi$R is activated when the active command is applied, and is deactivated when the precharge command is applied. Signal $\phi$C is activated for activating the column-related circuits when the read command or write command is applied.

Figure 3:
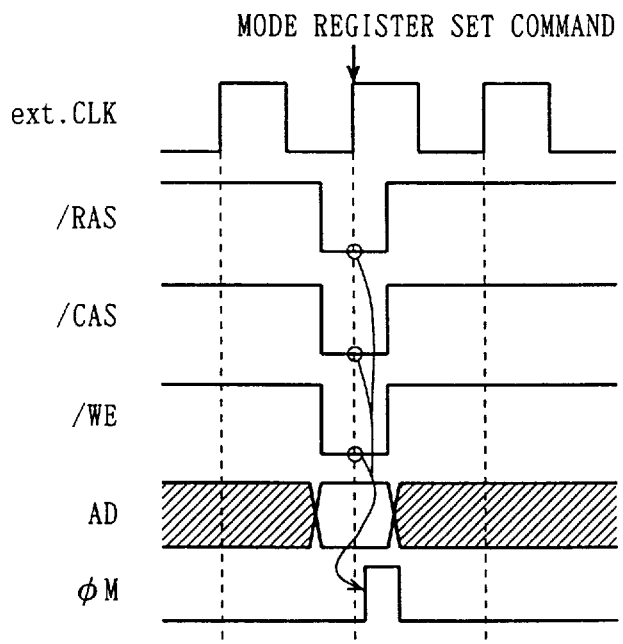
FIG. 3 shows a timing relationship between control signals at the time of data setting in a mode register shown in FIG. 2.

FIG. 3 is a timing chart representing an operation of setting operation mode designating data in mode register 30. In FIG. 3, row address strobe signal /RAS, column address strobe signal /CAS and write enable signal /WE are all set to L-level at the rising edge of external clock signal extCLK. The combination of these states of signals is called a mode register set command, by which mode register set instructing signal $\phi$M from control signal generating circuit 13 shown in FIG. 2 is driven to the active state of H-level for a predetermined period. In accordance with activation of mode register set instructing signal $\phi$M, mode register 30 takes in a specific address bit AD in the external address signal, and generates an internal signal corresponding to the designated operation mode. Modes designated by this operation mode designating data are, for example, the CAS latency and burst length as already described.

Figure 4:
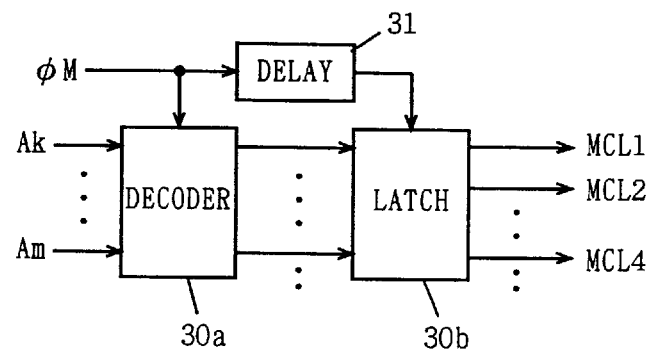
FIG. 4 schematically shows a structure of the mode register shown in FIG. 2.

FIG. 4 schematically shows an example of a structure of mode register 20 shown in FIG. 2. In FIG. 4, mode register 30 includes a decoder 30a which is activated in response to activation of mode register set instructing signal $\phi$M from control signal generating circuit 13 shown in FIG. 2, and decodes signals Ak, . . . , Am applied to predetermined address input terminals, and a latch 30b which latches an output signal of decoder 30a and generates CAS latency designating signal MCL1, MCL2, . . . , MCL4, . . . . Latch 30b takes in and latches the output signal of decoder 30a in response to activation of an output signal of a delay circuit 31 which delays mode register set instructing signal $\phi$M by a predetermined time.

CAS latency designating signals MCL1–MCL4, . . . from latch 30b are applied to clock counter 17 shown in FIG. 2. Clock counter 17 is also supplied with the burst length data stored in mode register 30.

Figure 5:
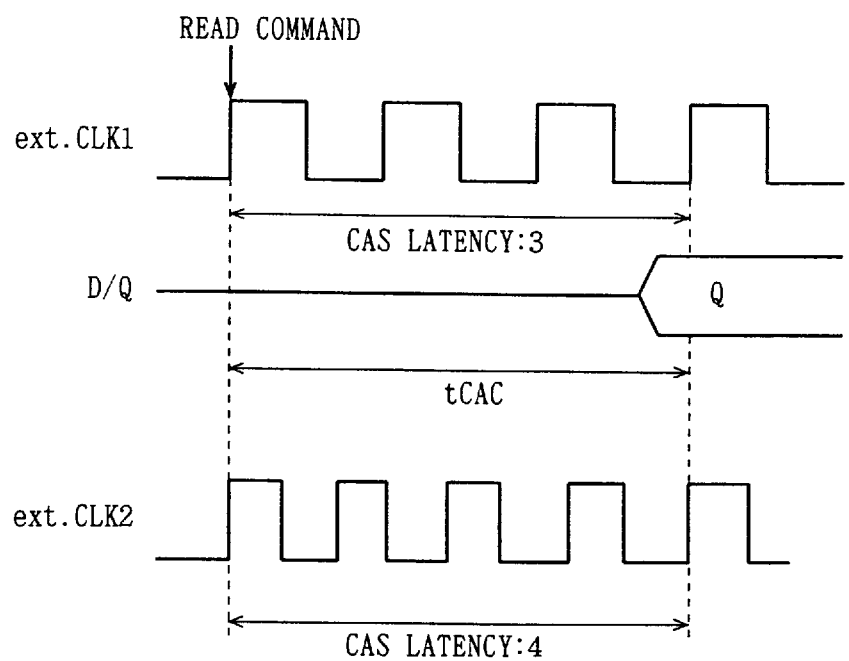
FIG. 5 shows a relationship between a clock signal and a CAS latency.

FIG. 5 schematically shows a relationship between the CAS latency and the frequency of the external clock signal. In the data read operation of the SDRAM, a substantially fixed time is required for externally reading out data latched in the sense amplifier. This time corresponds to a time called a CAS access time tCAS in a standard DRAM. If the CAS latency is set to 3, valid data Q is read out and sampled when three clock cycles of external clock signal extCLK elapse after application of the read command. If the CAS latency is set to 4, valid data Q is generated and sampled when four clock cycles of external clock signal extCLK elapse. A time required from application of the read command to definition of the valid data substantially corresponds to CAS access time tCAC. If the CAS latency is set to 3, therefore, the frequency of an external clock signal extCLK1 is lower than that of an external clock signal extCLK2 in the case that the CAS latency is set to 4. The CAS latency set to 4 corresponds to an operation environment using a fast clock. The CAS latency shorter than 4 corresponds to an operation environment using a slow clock. By using signal MCL4 indicating whether the CAS latency is 4 or not, therefore, the operation mode of the SDRAM can be switched between the 2-bit prefetch type and the pipelined type, and internal data writing corresponding to the operation environments can be implemented.

More specifically, when CAS latency 4 designating signal MCL4 is active and indicates that CAS latency is set to 4, this represents that a fast clock is used, and the SDRAM is operated in the 2-bit prefetch mode. When CAS latency 4 designating signal MCL4 is inactive and the CAS latency is set to a value smaller than 4, this represents that a slow clock is used, and the SDRAM is operated in a pipelined manner.

Setting of the CAS latency data into the mode register is performed by a user depending on the application of the SDRAM (a default value may be used). By using CAS latency 4 designating signal MCL4 as a data transfer mode designating signal, the user can operate the SDRAM in the optimum mode corresponding to the operation environment without an awareness of the internal data transfer mode in the SDRAM. Then, an operation of the SDRAM shown in FIGS. 1 and 2 will be described below with reference to timing charts shown in FIGS. 6 and 7.

Figure 6:
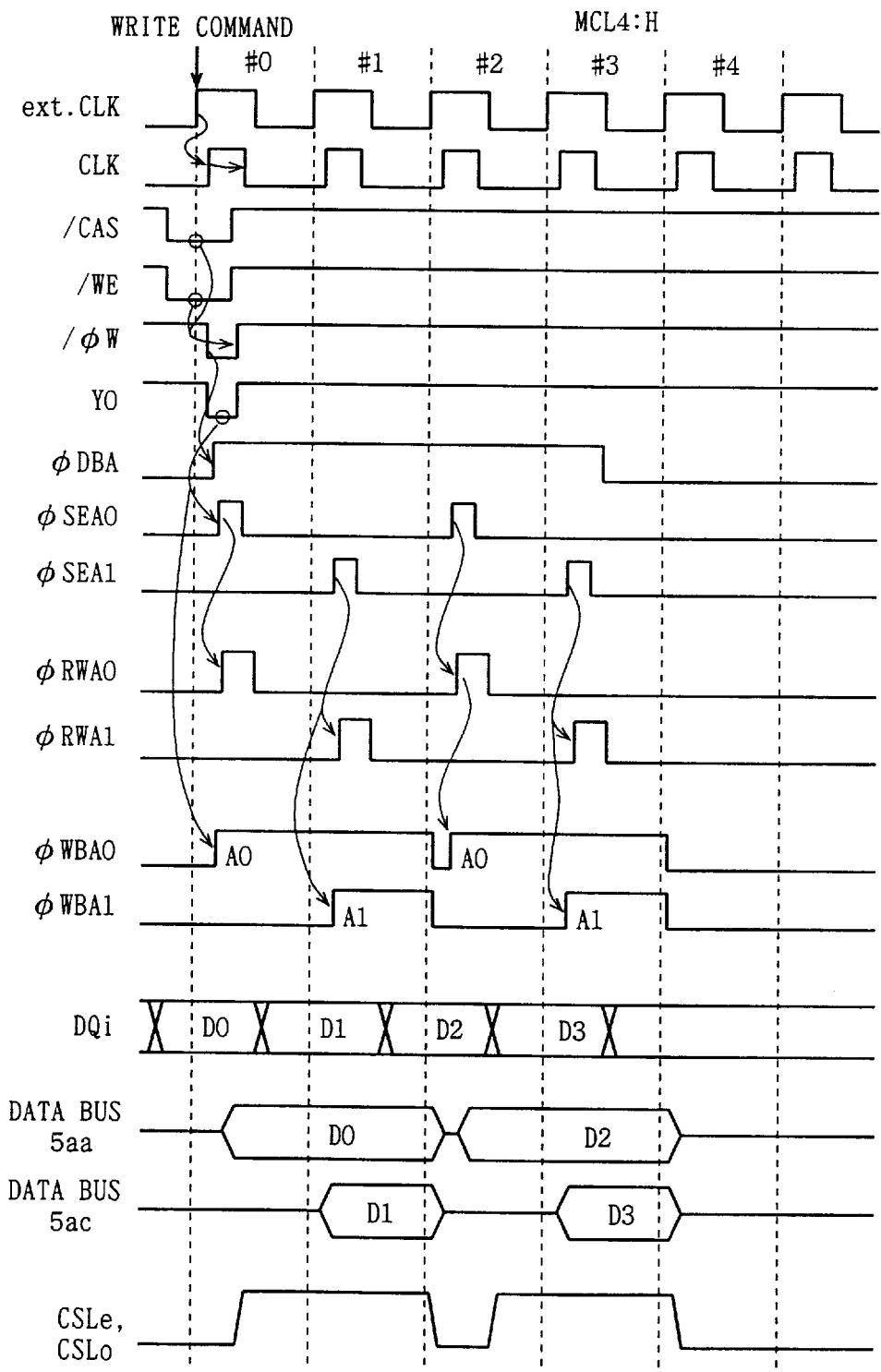
FIG. 6 is a timing chart representing a data write operation performed with a CAS latency of 4 by the semiconductor memory device of the embodiment 1 of the invention.

Referring first to FIG. 6, description will be given on an operation sequence in such a case that the CAS latency is set to 4, and the operation is performed in synchronization with a fast clock.

At the rising edge of external clock signal extCLK in clock cycle #0, external column address strobe signal /CAS and write enable signal /WE are both set to L-level. Row address strobe signal /RAS which is at H-level is not shown in this and following figures, because it does not directly concern with the read and write commands. The write command is applied, and write activating signal /$\phi$W from control signal generating circuit 13 becomes the active state of L-level for a predetermined period. Also, Y-address buffer 15 takes in the externally applied address signal, and produces the internal column address signal. Y-address operation circuit 16 generates the internal column address signal in accordance with the address signal from Y-address buffer 15.

It is now assumed that the lowest bit Y0 of the internal column address signal is "0", bank address signal BY is "1" (H-level), bank A is designated, and it is also designated that data writing is effected on memory array 1$aa$ first. In accordance with bank address signal BY, input buffer activating signal $\phi$DBA from control signal generating circuit 32 attains the active state of H-level. Input buffer activating signal $\phi$DBA stays active for a clock cycle period designated by the burst length data. Data which is applied to data I/O terminal 6 is applied to selector 8$a$ through active input buffer 7$a$. First, selector 8$a$ transmits data applied from input buffer 7$a$ to write register 9$aa$ in accordance with activation of select signal $\phi$SEA0. At this time, the other select signal $\phi$SEA1 is in the inactive state of L-level, and transfer of input data to write register 9$ab$ does not take place.

Write register 9$aa$ takes in the data applied from selector 8$a$ in response to activation of register activating signal $\phi$RWA0, and then latches the same. In response to select signal $\phi$SEA0, write buffer activating signal $\phi$WBA0 is activated, so that write buffer 10$aa$ is activated to amplify the data, which is taken into and latched by write register 9$aa$, and transmit the amplified data onto internal data bus 5$aa$. Therefore, write data D0 applied in clock cycle #0 is transmitted onto data bus 5$aa$. At this time, for memory arrays 1$aa$ and 1$ab$, Y-decoder groups 4$aa$ and 4$ab$ perform decoding in accordance with internal column address signals YE0–YEk and YO0–YOk from Y-address operation circuit 16, and column select signals CSLe and CSLo are driven to the selected state.

In clock cycle #1, write data D1 is made definite. Write data D1 thus made definite is applied to selector 8$a$ through input buffer 7$a$. Selector 8$a$ applies the received write data to write register 9$ab$ in accordance with activation of select signal $\phi$SEA1. Write register 9$ab$ takes in and latches the write data in accordance with register activating signal $\phi$RWA1. In accordance with activation of select signal $\phi$SEA1, write buffer activating signal $\phi$WBA1 is driven to the active state, and write buffer 10$ab$ amplifies data D1 stored in write register 9$ab$ for transmission onto internal data bus 5$ab$. Thereby, data D1 is transmitted to the column designated by column select signal CSLo in memory array 1$ab$. Two clock cycles are utilized before writing data from write buffers 10$aa$ and 10$ab$ to the selected columns of memory arrays 1$aa$ and 1$ab$.

When writing of data D0 and D1 of 2 bits is completed, write buffer activating signals $\phi$WBA0 and $\phi$WAB1 are reset to the inactive state, and internal data buses 5$aa$ and 5$ab$ are equalized to a level of a predetermined potential (intermediate potential in FIG. 6) by equalize circuit 11$a$.

In clock cycle #2, data D2 is applied to selector 8$a$ through input buffer 7$a$. Selector 8$a$ transmits the received data to write register 9$aa$ in accordance with select signal $\phi$SEA0. Data D2 is transmitted onto internal data bus 5$aa$ through write buffer 10$aa$ which is activated in accordance with activation of write buffer activating signal $\phi$WBA0. At this time, Y-address operation circuit 16 changes the address signal using burst address counter (not shown), so that the column selection is performed in accordance with new column address signals YE0–YEk and YO0–YOk, and the selected columns are connected to internal data buses 5$aa$ and 5$ab$.

When data D3 is applied in clock cycle #3, select signal $\phi$SEA1 and register activating signal $\phi$RWA1 are made active, and the write data is applied to write buffer 10$ab$ through selector 8$a$ and write register 9$ab$. Write buffer 10$ab$ is activated in response to activation of write buffer activating signal $\phi$WBA1, and transmits received data D3 onto internal data bus 5$ab$ after amplifying the same. The burst length is 4. Also, buffer activating signal $\phi$DBA is deactivated in clock cycle #3, and a new write command is not applied. Therefore, the data write operation is finished.

In each of signal pairs, i.e., select signal pair $\phi$SEA0 and $\phi$SEA1, register activating signal pair $\phi$RWA0 and $\phi$RWA1, and write buffer activating signal pair $\phi$DBA0 and $\phi$DBA1, one signal is activated first, and the signals to be activated first are determined by the lowest bit Y0 of the column address signal. The lowest bit Y0 of the internal column address signal is used for designating memory arrays 1$aa$ and 1$ab$. Memory array 1$aa$ includes columns of even-numbered column addresses, and memory array 1$ab$ includes columns of odd-numbered column addresses. Internal column address signals YE0–YEk and YO0–YOk from Y-address operation circuit 16, therefore, correspond to column address signal Y1–Yk+1 applied from Y-address buffer 15.

Figure 7:
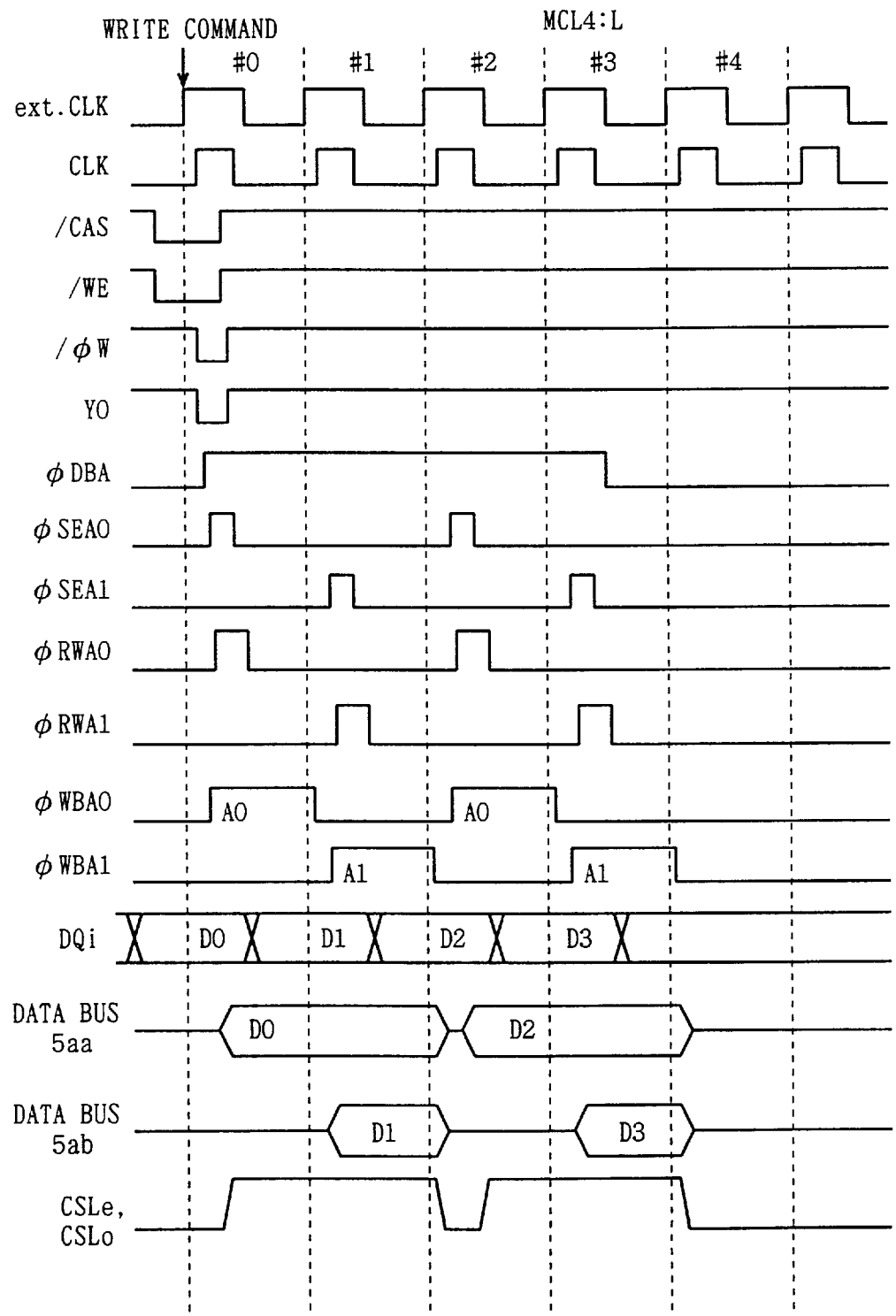
FIG. 7 is a timing chart showing a data write operation performed with a CAS latency of 3 by the synchronous semiconductor memory device of the embodiment 1 of the invention.

Referring to FIG. 7, description will now be given on an operation in such a case that CAS latency 4 designating signal MCL4 is set to L-level. When CAS latency 4 designating signal MCL4 is at L-level, this represents that the clock signal of this SDRAM is slow, and the SDRAM performs the pipelined operation. In the operation represented by an operation waveform shown in FIG. 7, bank A is designated, column address bit Y0 is set to L-level ("0"), and an even-numbered address is designated as the leading address.

In clock cycle #0, column address strobe signal /CAS and write enable signal /WE are both set to L-level, and the write command is applied. In accordance with this write command, write instructing signal /$\phi$W falls to L-level representing the active state, and the column selection starts. In accordance with activation of write instructing signal /$\phi$W, and in accordance with the lowest column address signal bit Y0, buffer activating signal φDBA for input buffer 7a is activated. This operation is the same as that of the 2-bit prefetch type already described.

Then, in accordance with the value of the lowest column address signal bit Y0, control signal generating circuit 32 shown in FIG. 2 keeps select signal φSEA0 active for a predetermined period, and then activates register activating signal φRWA0. Thereby, selector 8a transfers and stores the write data, which is applied through input buffer 7a, in write register 9aa. Write buffer activating signal φDBA0 is activated, and write buffer 10aa amplifies the data stored in write register 9aa for transmission onto internal data bus 5aa. In clock cycle #0, Y-decoder groups 4aa and 4ab perform column selection in accordance with internal column address signals YE0–YEk and YO0–YOk from Y-address operation circuit 16, and corresponding select signals CSLe and CSLo are activated. Thereby, transfer data D0 from write buffer 5aa is transmitted onto the selected column in memory array 1aa.

In clock cycle #1, write buffer activating signal φWBA0 is deactivated, and write buffer 10aa attains the output high impedance state. In memory array 1aa, column select signal CSLe is active, and the selected memory cells are coupled to internal data bus 5aa. However, data of the memory cell on the selected column is latched by the sense amplifier included in sense amplifier group 3aa, and the write data does not change. In memory array 1ab, the selected column is connected to internal data bus 5ab, and the memory cell data on the selected column is latched by the corresponding sense amplifier included in sense amplifier group 3ab (write buffer 10ab is in the output high impedance state).

In clock cycle #1, select signal φSEA1 from control signal generating circuit 32 is activated, and then register activating signal φWBA1 is activated. Thereby, the write data applied through input buffer 7a is stored in write register 9ab through selector 8a. Then, write buffer activating signal φWBA1 is activated, and write buffer 10ab amplifies the data stored in write register 9ab for transmission onto internal data bus 5ab. Then, the data is transmitted onto the selected column in memory array 1ab. The memory cell data latched by the corresponding sense amplifier in the sense amplifier group changes in accordance with the write data, and the data writing is completed.

When two clock cycles are completed, internal column address signals YE0–YEk and YO0–YOk from Y-address operation circuit 16 change, and equalize circuit 11a is temporarily activated to set internal data buses 5aa and 5ab to a predetermined potential. Then, Y-decoder groups 4aa and 4ab perform column selection, and drive the corresponding columns in memory arrays 1aa and 1ab to the selected state, respectively. In this clock cycle #2, select signal φSEA0 is activated, and then register activating signal φRWA0 is activated. Thereby, the applied write data D2 is stored in write register 9aa through input buffer 7a and selector 8a. Then, write buffer activating signal φWBA0 is activated, and write buffer 10aa amplifies data D2 stored in write register 9aa for transmission onto internal data bus 5aa. Then, the write data on internal data bus 5aa is written into the selected memory cells in memory array 1aa.

When writing of data D2 is completed in clock cycle #2, write buffer activating signal φWBA0 is deactivated again. In clock cycle #3, select signal φSEA1 and register activating signal φRWA1 are activated, and then write buffer activating signal φWBA1 is activated, so that data D3 is transmitted onto internal data bus 5ab through selector 8a, write register 9ab and write buffer 10ab, and is written into the selected memory cells in memory array 1ab. The burst length is 4, and input buffer activating signal φDBA is deactivated to attain L-level when writing of 4-bit data (per one terminal) is completed, and the data write operation is completed. Y-address operation circuit 16 is also deactivated, and the selected columns in memory arrays 1aa and 1ab are deactivated.

In the pipelined operation shown in FIG. 7, the operation of selecting the columns in memory arrays 1aa and 1ab is performed every two clock cycles. Write buffers 10aa and 10ab are alternately driven to the active state every clock cycle. By shifting the timings of activation of write buffers 10aa and 10ab from those in the 2-bit prefetch method, therefore, both the 2-bit prefetch method and the pipelined method can be achieved without a significant change in construction of the device.

Although the above description has been given on the operation when bank A is selected, the operation is performed similarly when bank B is selected. When the lowest column address signal bit Y0 is "1" (H-level), data writing for memory array 1ab is performed prior to data writing for memory array 1aa.

Here, data transfer has been described in connection with the 2-bit prefetch method and the pipelined method. In the pipelined method, however, data is successively transmitted in accordance with the clock signal. In the 2-bit prefetch method, data of 2-bit is written during 2 clock cycles. When a faster clock cycle is employed, the prefetched bits are increased in number, and correspondingly the clock cycles utilized for data writing are increased in number. Thereby, data writing can be performed accurately in accordance with the operation cycle. Data is written through write buffer 1aa, and next write data is transferred to write register 9ab by utilizing a period from deactivation of write buffer 1aa to activation of write buffer 1ab. Likewise, fast writing of data can be performed in a pipelined manner by alternately utilizing registers 9aa and 9ab. When the CAS latency is set to 3 or less (the signal MLC4 is at L-level), only one of the write buffers having large driving capability is activated in each clock cycle, so that the current consumption at the write buffers can be reduced. Structures of respective portions will be described below.

Figure 8:
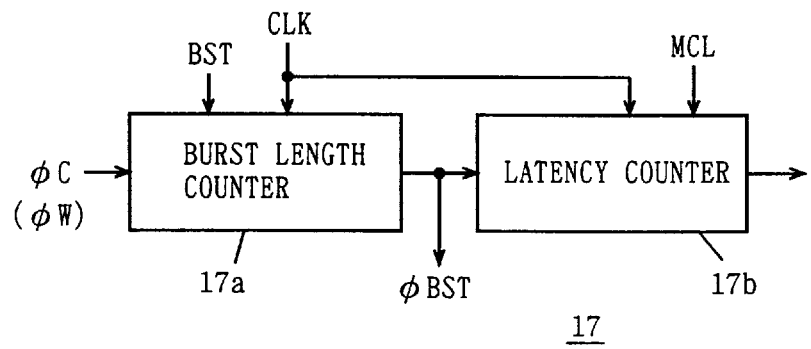
FIG. 8 schematically shows a structure of a clock counter shown in FIG. 2.

FIG. 8 schematically shows a structure of a clock counter 17 shown in FIG. 2. In FIG. 8, clock counter 17 includes a burst length counter 17a which is activated in response to activation of column-related activating signal φC or write instructing signal φW, and counts the clock cycle period designated by burst length data signal BST to generate count-up signal φBST in response to count-up thereof, and a latency counter 17b which delays the count-up signal of burst length counter 17a for a clock cycle period designated by latency data signal MCL.

Burst length counter 17a and latency counter 17b are supplied with internal clock signal CLK. Burst length data signal BST and CAS latency data signal MCL are both generated from mode register 30 shown in FIG. 2. Burst length counter 17a and latency counter 17b are formed of shift registers, and transfer the received column-related activating signal φC in synchronization with internal clock signal CLK. Output signals of burst length counter 17a and latency counter 17b are applied to control signal generating circuit 32 shown in FIG. 2.

Figure 9:
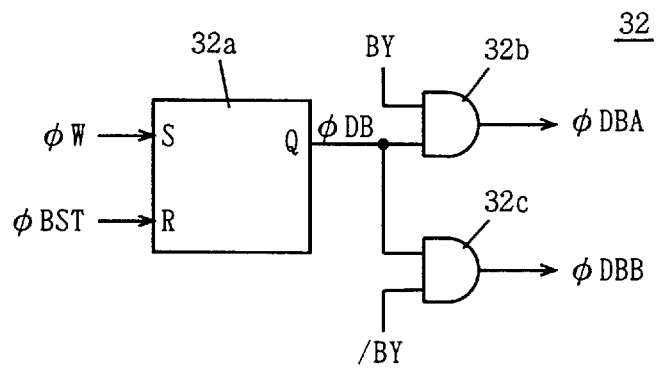
FIG. 9 schematically shows a structure of an input buffer activating signal generating portion included in a control signal generating circuit shown in FIG. 2.

FIG. 9 schematically shows a structure of a portion of generating the input buffer activating signal. The portion shown in FIG. 9 and provided for generating input buffer activating signals φDBA and φDBB is included in control signal generating circuit 32 shown in FIG. 2.

In FIG. 9, the input buffer activating signal generating portion includes a set/reset flip-flop 32a which is set in response to activation of write mode designating signal φW, and is reset in response to activation of count-up signal φBST from burst length counter 17a shown in FIG. 8, an AND circuit 32b which receives signal φDB from an output Q of set/reset flip-flop 32a as well as bank address signal BY, and an AND circuit 32c which receives signal φDB and bank address signal /BY. AND circuit 32b generates input buffer activating signal φDBA, and AND circuit 32c generates input buffer activating signal φDBB. Then, an operation of the input buffer activating signal generating portion shown in FIG. 9 will be described below with reference to a timing chart of FIG. 10.

Figure 10:
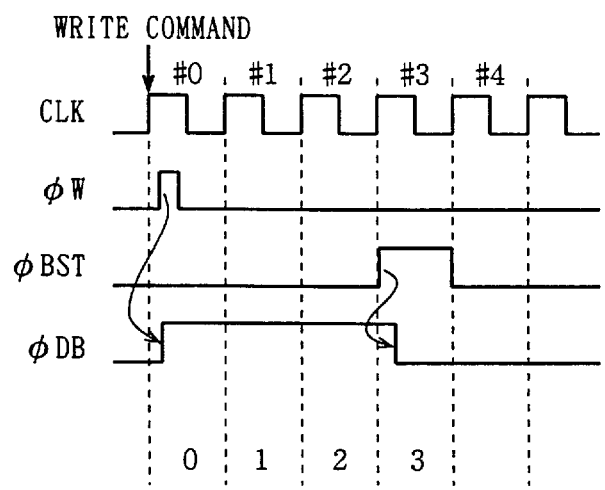
FIG. 10 is a timing chart representing an operation of an input buffer activating signal generating portion shown in FIG. 9.

Referring to FIG. 10, the write command is applied in clock cycle #0, and data write instruction signal φW is driven to the active state of H-level for a predetermined period, so that set/reset flip-flop 32a is set, and signal φDB rises to H-level. Burst length counter 17a shown in FIG. 8 continues the counting in accordance with column-related activating signal φC produced by the write command. When the designated burst length is 4, count-up signal φBST from burst length counter 17a shown in FIG. 8 rises to H-level in clock cycle #3 when 4 clock cycles are counted, and set/reset flip-flop 32a is reset to lower signal φDB to L-level. One of input buffer activating signals φDBA and φDBB is set to the active state of H-level in accordance with bank address signals BY and /BY as well as signal φDB, and writing of data into the select bank is completed in clock cycle #3 (the burst length is 4).

In the structure shown in FIG. 9, count-up signal φBST from burst length counter 17a shown in FIG. 8 is applied to set/reset flip-flop 32a. For reliably taking in the data applied in clock cycle #3, however, such a structure may be employed that a pulse signal of one shot is generated in accordance with count-up signal φBST, and this one-shot pulse signal is applied to set/reset flip-flop 32a after being delayed by a predetermined period. This delay time is equal to a period required for taking the write data, which is applied in clock cycle #3, into the input buffer and transferring the same to the write register through the selector.

Alternatively, such a structure may be employed that burst length counter 17a (see FIG. 8) counts the falling of internal clock signal CLK, and count-up signal φBST is generated when the count of falling of internal clock signal CLK reaches the number equal to the burst length.

Burst length counter 17a (see FIG. 8) resets count-up signal φBST when it receives active column-related activating signal φC. When the write command is applied in clock cycle #3, therefore, data is continuously written again in accordance with the write command.

Figure 11:
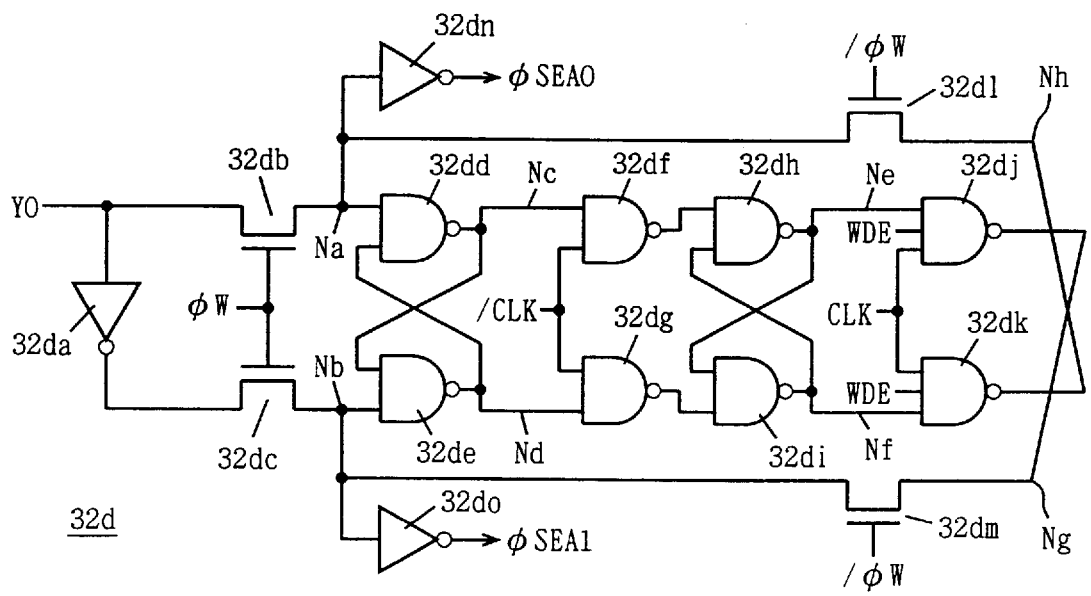
FIG. 11 shows a structure of a portion for generating a select signal applied to a selector shown in FIG. 1.

FIG. 11 shows a structure of a portion of generating the select signal applied to the selector. The select signal generating portion shown in FIG. 11 is included in control signal generating circuit 32 shown in FIG. 2. FIG. 11 also shows a structure of a portion for generating select signals φSEA0 and φSEA1 for bank A. The portion for generating select signals φSEB0 and φSEB1 for bank B has a similar structure.

In FIG. 11, a select signal generating portion 32d includes an inverter 32da receiving the lowest internal column address signal Y0, transfer gates 32db and 32dc formed of n-channel MOS transistors, which are turned on in response to activation of write operation instructing signal φW and transmit the lowest column address signal bit Y0 from Y-address buffer 15 and an output signal of inverter 32da to nodes Na and Nb, respectively, and NAND circuits 32db and 32de for latching signal potentials on nodes Na and Nb, respectively. NAND circuit 32dd has one input connected to a node Na and another input connected to an output node of NAND circuit 32de. NAND circuit 32de has one input connected to a node Nb and another input connected to an output node of NAND circuit 32dd.

Select signal generating portion 32d further includes a NAND circuit 32df which receives an output signal of NAND circuit 32db and inverted signal /CLK of internal clock signal CLK, a NAND circuit 32dg which receives an output signal of NAND circuit 32de and inverted internal clock signal /CLK, and NAND circuits 32dh and 32di for latching output signals of NAND circuits 32df and 32dg, respectively. NAND circuit 32dh has one input connected to an output node of NAND circuit 32df, and another input connected to an output node of NAND circuit 32di. NAND circuit 32di has one input connected to an output node of NAND circuit 32dg, and another input connected to an output node of NAND circuit 32dh.

Select signal generating portion 32d further includes a NAND circuit 32dj which receives an output signal of NAND circuit 32dh, write operation activating signal WDE and internal clock signal CLK, a NAND circuit 32dk which receives an output signal of NAND circuit 32di, write operation activating signal WDE and internal clock signal CLK, transfer gates 32dl and 32dm formed of n-channel MOS transistors, which are turned on in response to H-level of inverted signal /φW of the write operation instructing signal and transmit output signals of NAND circuits 32dk and 32dj to nodes Na and Nb, respectively, an inverter 32dn which generates select signal φSEA0 by inverting the signal potential on node Na, and an inverter 32do which generates select signal φSEA1 by inverting the signal potential on node Nb. An operation of select signal generating circuit 32d shown in FIG. 11 will be described below with reference to a timing chart of FIG. 12.

Figure 12:
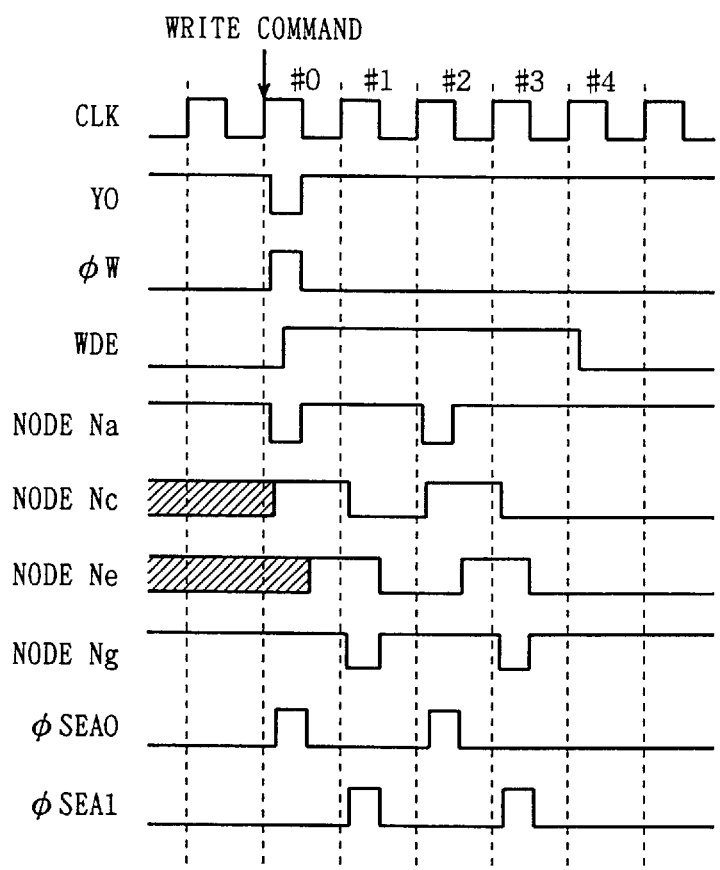
FIG. 12 is a timing chart representing an operation of the select signal generating portion shown in FIG. 11.

In clock cycle #0, the write command is applied, and write operation instructing signal φW is set to and kept at the active state of H-level for a predetermined period. Lowest bit Y0 of the column address signal is taken in in accordance with the address signal which is applied simultaneously with the write command. FIG. 12 shows an operation in such a case that lowest column address signal bit Y0 is set to L-level ("0"). When write operation instructing signal φW attains the active state of H-level, transfer gates 32dl and 32dm are turned off, and bit Y0 and the output signal of inverter 32de are transmitted onto nodes Na and Nb, respectively. The signal potentials on nodes Na and Nb are latched by the latch circuit formed of NAND circuits 32dd and 32de. Lowest column address signal bit Y0 is at L-level, and nodes Na and Nb are set to L- and H-levels, respectively. Owing to the signal potential at L-level on node Na, the output signal of NAND circuit 32dd attains H-level, and node Nc is fixed at H-level from the previous state. Node Nd is set to L-level. Internal clock signal /CLK is at L-level, and the output signals of NAND circuits 32df and 32dg are at H-level.

When internal clock signal CLK falls to L-level, write operation instructing signal φW correspondingly falls to L-level and transfer gates 32db and 32dc are turned off. Also, transfer gates 32dl and 32dm are turned on. In this state, internal clock signal CLK is at L-level, and the output signals of both NAND circuits 32dj and 32dk attain H-level, so that both nodes Na and Nb are fixed to H-level. Inverter 32dn inverts the signal potential on node Na. Therefore, select signal φSEA0 is first set to H-level in accordance with L-level on internal node Na. Node Nb is at H-level, and select signal φSEA1 holds L-level.

When internal clock signal CLK falls to L-level, internal clock signal /CLK attains H-level, and the signal potentials on nodes Nc and Nd are inverted by NAND circuits 32df and 32dg, respectively. The signal potentials thus inverted are transmitted to and latched by NAND circuits 32dh and 32di. In response to falling of internal clock signal CLK, therefore, the signal potential on node Ne is set to H-level in accordance with the signal at H-level on node Nc. Meanwhile, node Nf is set to L-level. This state is maintained until internal clock signal /CLK attains H-level again.

When internal clock signal CLK attains H-level again in clock cycle #1, NAND circuits 32dj and 32dk operate as inverters so that the output signal of NAND circuit 32dj attains L-level in accordance with H-level of the signal potential on node Ne, and the signal potential at H-level on node Ng is transmitted onto node Nb through transfer gate 32dm. In clock cycle #1, therefore, select signal φSEA1 rises to H-level and stays thereat for a predetermined period. The potential on internal node Na is at H-level (the output signal of NAND circuit 32dk is at H-level), and select signal φSEA0 maintains L-level.

The signals at H- and L-levels on nodes Na and Nb in clock cycle #1 are latched by NAND circuits 32dd and 32de. In clock cycle #1, therefore, the potential on node Nc falls to L-level, and the potential on node Nd attains H-level. When internal clock signal /CLK rises to H-level, NAND circuits 32df and 32dg operate as inverters, and transmit the signal potentials on nodes Nc and Nd to NAND circuits 32dh and 32di, respectively. In clock cycle #1, therefore, the signal potential on node Ne falls from H-level to L-level in response to falling of internal clock signal CLK, and the potential on node Nf attains H-level. While internal clock signal CLK is at L-level, the output signals of NAND circuits 32dj and 32dk are at H-level, and select signals φSEA0 and φSEA1 maintain L-level.

In clock cycle #2, internal clock signal CLK rises to H-level again. Thereby, NAND circuits 32dj and 32dk function as inverters, and the signal potentials on nodes Ne and Nf are transmitted onto node Na and Nb, respectively. In clock cycle #2, therefore, node Na attains L-level, and node Nb maintains H-level. Therefore, select signal φSEA0 is generated again in clock cycle #2.

Operations similar to those in the clock cycles #0 and #1 are performed again. In clock cycle #3, select signal φSEA1 is kept in the active state of H-level for a predetermined period. Write operation activating signal WDE is set to the inactive state of L-level when clock cycles represented by the burst length elapse after application of the write command. In clock cycle #4, therefore, write operation activating signal WDE attains the inactive state of L-level, and the output signals of NAND circuits 32dj and 32dk are fixed at H-level. Thereby, nodes Na and Nb attain H-level, and the latch formed of NAND circuits 32dd and 32de maintains the state in clock cycle #3. NAND circuits 32df and 32dg invert and transmit the signal potentials on nodes Nc and Nd in accordance with internal clock signal /CLK, respectively. Therefore, nodes Ne and Nf are set to the potential levels corresponding to the states of internal nodes Nc and Nd in synchronization with falling of internal clock signal CLK in clock cycle #3, and thereafter maintain the levels thus set, respectively.

As described above, the lowest column address signal bit Y0 is taken in only in the cycle during which the write command is applied, and it is determined which of select signals φSEA0 and φSEA1 is to be driven to the active state first. After the lowest column address signal bit Y0 is taken in, a ring-type shift register is formed to perform circulating transmission in accordance with clock signals CLK and /CLK, so that select signals φSEA0 and φSEA1 are alternately activated every clock cycle.

Figure 13:
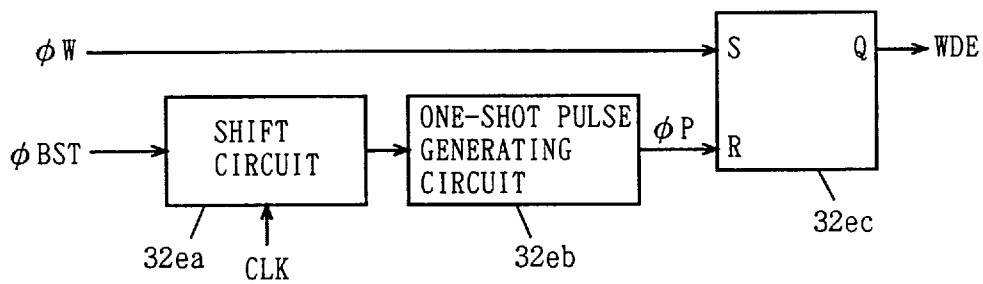
FIG. 13 schematically shows a structure of a write operation activating signal generating portion shown in FIG. 11.
Figure 14:
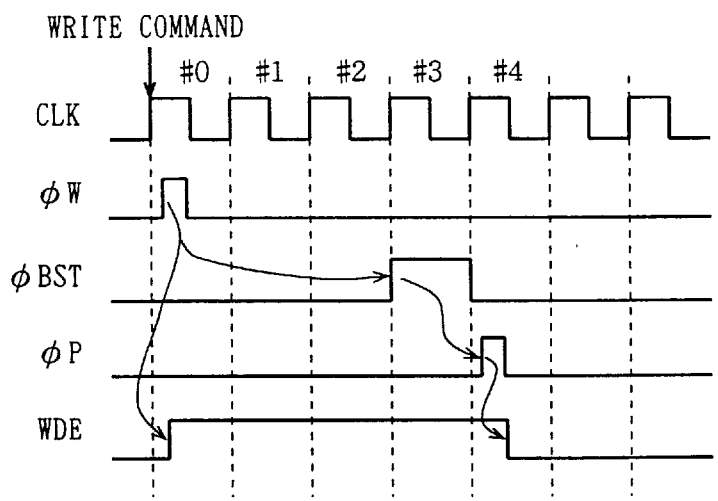
FIG. 14 is a timing chart representing an operation of the write operation activating signal generating portion shown in FIG. 13.

FIG. 13 shows a structure of a portion generating write operation activating signal WDE shown in FIG. 11. In FIG. 13, a write operation activating signal generating portion 32e includes a shift circuit 32ea which shifts count-up signal φBST from the burst length counter in accordance with internal clock signal CLK and delays the same by one clock cycle, one-shot pulse generating circuit 32eb which generates a one-shot pulse signal φP having a predetermined time width in response to rising of an output signal of shift circuit 32ea, and a set/reset flip-flop 32ec which is set in response to activation of write operation instructing signal φW and is reset in response to one-shot pulse signal φP from one-shot pulse generating circuit 32eb. Set/reset flip-flop 32ec generates write operation activating signal WDE from its output Q. An operation of the write operation activating signal generating portion shown in FIG. 13 will be described below with reference to a timing chart of FIG. 14.

When the write command is applied in clock cycle #0, write operation instructing signal φW is set to and kept for a predetermined period at H-level. In response to activation of write operation instructing signal φW, set/reset flip-flop 32ec is set, and write operation activating signal WDE rises to H-level. The burst length counter is activated in response to activation of write operation instructing signal φW, and counts the clock cycles of the burst length. In clock cycle #3, i.e., fourth clock cycle after application of the write command, count-up signal φBST from the burst length counter rises to H-level.

Shift circuit 32ea delays count-up signal φBST by one clock cycle. Therefore, shift circuit 32ea generates a signal which rises to H-level in clock cycle #4. One shot pulse generating circuit 32eb generates pulse signal φP of one shot in response to rising of the output signal of shift circuit 32ea. One-shot pulse signal φP resets set/reset flip-flop 32ec, and write operation activating signal WDE attains the inactive state of L-level.

Only during a period determined by the burst length data, the select signals are alternately generated, and data can be written alternately into the write registers.

Figure 15:
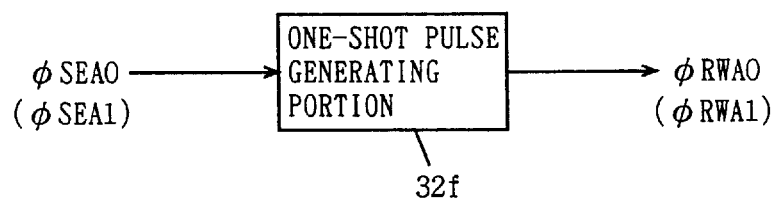
FIG. 15 schematically shows a structure of a write register activating signal generating portion shown in FIG. 1.

FIG. 15 schematically shows a structure of a portion generating write register activating signal. FIG. 15 shows a portion for write register activating signal φRWA0. In FIG. 15, the write register activating signal generating portion includes a one-shot pulse generating circuit 32f generating a pulse signal of one shot, which attains H-level and stays thereat for a predetermined time in response to rising of select signal φSEA0. One-shot pulse generating circuit 32f generates register activating signal φRWA0. A similar one-shot pulse generating circuit is provided for select signal φSEA1, and write register signal φRWA1 is kept in the active state for a predetermined time in accordance with select signal φSEA1. When the selector transmits the write data, therefore, the register takes in the applied data, and the register attains the latch state in response to deactivation of write register signal φRWA0.

Figure 16:
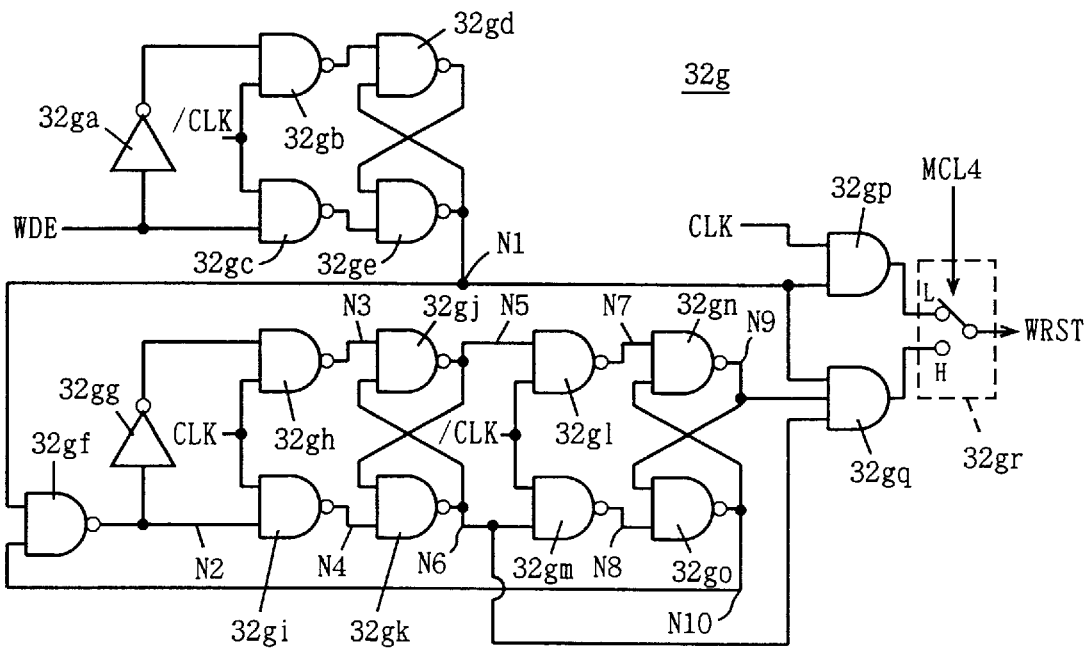
FIG. 16 shows a structure of a write buffer reset signal generating portion included in a control signal generating circuit shown in FIG. 2.

FIG. 16 shows a structure of a portion generating a write buffer reset signal. The write buffer is reset in accordance with a reset signal WRST from a reset signal generating portion 32g shown in FIG. 16.

In FIG. 16, reset signal generating portion 32g includes an inverter 32ga receiving write operation activating signal WDE, a NAND circuit 32gb receiving an output signal of inverter 32ga and internal clock signal /CLK, a NAND circuit 32gc receiving write operation activating signal WDE and internal clock signal /CLK, and NAND circuits 32gd and 32ge latching output signals of NAND circuits 32gd and 32gc, respectively. NAND circuit 32gd receives an output signal of NAND circuit 32gd at one input, and also receives an output signal of NAND circuit 32ge at the other input. NAND circuit 32ge receives the output signal of NAND circuit 32gc at one input, and receives the output signal of NAND circuit 32gd at the other input.

Reset signal generating portion 32g further includes a NAND circuit 32gf receiving an output signal of NAND circuit 32ge and a signal on node N10, an inverter 32gg receiving an output signal of NAND circuit 32gf, a NAND circuit 32gh receiving an output signal of inverter 32gg and internal clock signal CLK, a NAND circuit 32gi receiving an output signal of NAND circuit 32gf and internal clock signal CLK, and NAND circuits 32gj and 32gk for latching signals of NAND circuits 32gh and 32gi, respectively. NAND circuit 32gj has one input coupled to an output node N3 of NAND circuit 32gh and another input coupled to an output node N6 of NAND circuit 32gk. NAND circuit 32gk has one input coupled to an output node N4 of NAND circuit 32gi, and another input coupled to an output node N5 of NAND circuit 32gj.

Reset signal generating portion 32g further includes a NAND circuit 32gl receiving an output signal of NAND circuit 32gj and internal clock signal /CLK, a NAND circuit 32gm receiving an output signal of NAND circuit 32gk and internal clock signal /CLK, and NAND circuits 32gn and 32go for latching output signals of NAND circuits 32gl and 32gm, respectively. NAND circuit 32gn has one input connected to an output node N7 of NAND circuit 32gl, and another input connected to an output node N10 of NAND circuit 32go. NAND circuit 32go has one input coupled to an output node N8 of NAND circuit 32gm, and another input coupled to an output node N9 of NAND circuit 32gn.

Reset signal generating portion 32g includes an AND circuit 32gp receiving a signal on node N1 and internal clock signal CLK, an AND circuit 32gq receiving the signal on node N1, an output signal of NAND circuit 32gn and the output signal of NAND circuit 32gk, and a select circuit 32gr which selects one of outputs of NAND circuits 32gp and 32gq and generates write buffer reset signal WRST in accordance with CAS latency 4 designating signal MCL4.

Figure 17:
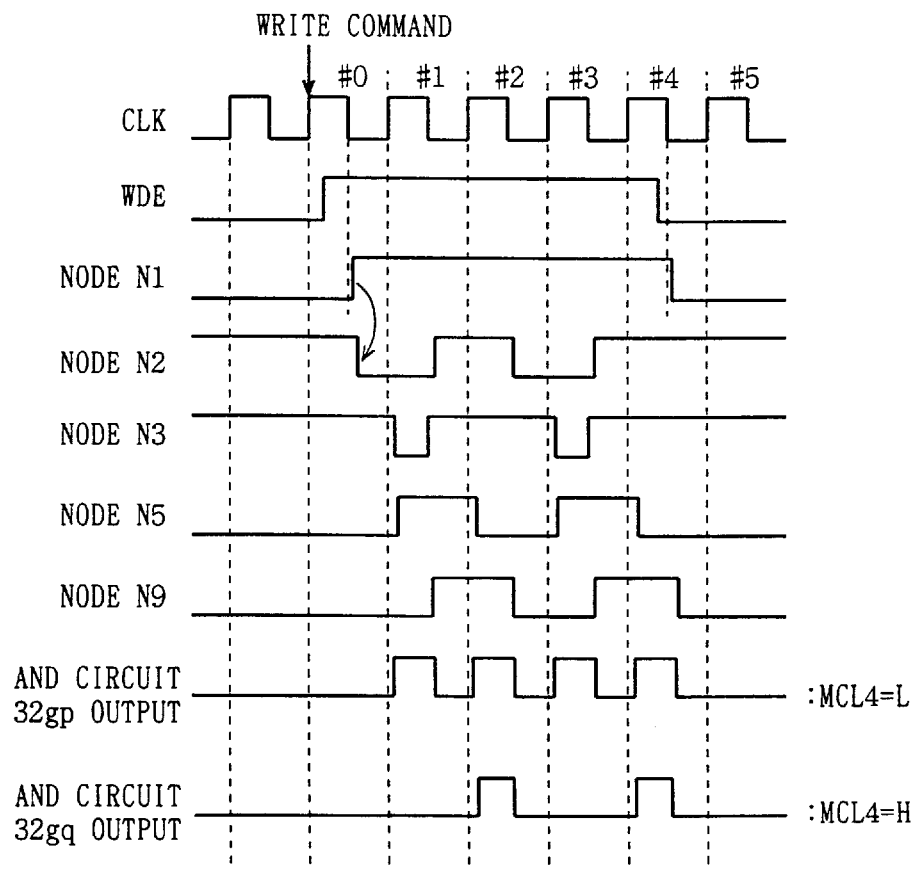
FIG. 17 is a timing chart representing an operation of the circuit shown in FIG. 16.

Select circuit 32gr selects the output signal of AND circuit 32gp when CAS latency 4 designating signal MCL4 is at L-level indicating that the CAS latency is smaller than 4. When CAS latency 4 designating signal MCL4 is in the active state of H-level, select circuit 32gr selects the output signal of AND circuit 32gp. An operation of reset signal generating portion 32g shown in FIG. 16 will be described below with reference to a timing chart of FIG. 17.

NAND circuits 32gb, 32gc, 32gd and 32ge take in and generate signals which are applied to their inputs, when internal clock signal /CLK is at H-level, and attain the latch state when internal clock signal /CLK attains L-level. Therefore, the signal potential on output node N1 of NAND circuits 32gb–32ge changes at each cycle of internal clock signal /CLK in accordance with the signal state of write operation activating signal WDE.

When the write command is applied in clock cycle #0, write operation activating signal WDE attains the active state of H-level in clock cycle #0. Before application of the write command, write operation activating signal WDE is at L-level, and the signal potential on node Nl is at L-level. Therefore, signal potential on node N2 is at H-level owing to NAND circuit 32gf.

The signal potential on node N2 is successively transmitted in accordance with internal clock signals CLK and /CLK. Therefore, node N10 is supplied with the potential on node N2 with a delay of 1 clock cycle. Accordingly, the signal potential on node N3 is at H-level, and the signal potential on node N5 is at L-level. Also, the signal potential on node N9 is at L-level, and the signal potential on node N10 is at H-level.

In clock cycle #0, after write operation activating signal WDE attains H-level, internal clock signal CLK falls to L-level, and internal clock signal /CLK attains H-level. Thereby, write operation activating signal WDE at H-level is transmitted onto node N1, and the signal potential on node N1 rises to H-level. Since the potential on node N10 is at H-level, the output signal of NAND circuit 32gf attains L-level in accordance with rising of the signal potential on node N1, and also the signal potential on node N2 attains L-level. Since internal clock signal CLK is at L-level, the output signals of NAND circuits 32gh and 32gi are at H-level, and the signal potential at L-level on node N2 is not transferred.

When internal clock signal CLK rises to H-level in clock cycle #1, NAND circuits 32gh and 32gi operate as inverters and transmit the signal potential on node N2, which is then latched by NAND circuits 32gj and 32gk. Correspondingly, the signal potential on node N3 attains L-level. Thereby, the potential on output node N5 of NAND circuit 32gj rises to H-level, and signal potential on node N6 falls to L-level. The signal potential on node N3 rises to H-level when internal clock signal CLK falls to L-level. When the signal potential on node N5 rises to H-level, internal clock signal /CLK is at L-level, and the output signals of NAND circuits 32gl and 32gm are at H-level, so that this signal potential is not transferred.

In clock cycle #1, internal clock signal CLK falls to L-level, and internal clock signal /CLK rises to H-level. Thereby, the signal potentials on nodes N5 and N6 are transmitted to and latched by NAND circuits 32gn and 32go through NAND circuits 32gl and 32gm, respectively. Correspondingly, the signal potential on node N9 rises to H-level in accordance with the signal potential on node N5. When signal potential on node N9 rises to H-level, the signal potential on node N10 attains L-level, and correspondingly the signal potential on node N2 rises to H-level.

Thereafter, the signal potential on node N2 is transmitted onto node N6 with a delay of half the clock cycle of internal clock signal CLK, and the signal potential on node N6 is transmitted onto node N10 with a delay of half the clock cycle of internal clock signal CLK. Therefore, the signal potential on node N5 attains L-level in clock cycle #2, and the signal potential on node N5 attains H-level in clock cycle #3. Meanwhile, node N9 receives the signal potential on node N5 with a delay of half the clock cycle of internal clock signal CLK.

When a newly set burst length period expires, write operation activating signal WDE falls to the inactive state of L-level in clock cycle #4. In this clock cycle #4, the signal potential at L-level is transmitted onto node N1 in accordance with falling of internal clock signal CLK, and the potential on node N2 is set to H-level, so that reset signal generating portion 32g is reset.

AND circuit 32gp receives internal clock signal CLK and the signal potential on node N1. Therefore, the output signal of AND circuit 32gp rises to H-level in synchronization with rising of internal clock signal CLK in each of clock cycles #1, #2, #3 and #4. Meanwhile, AND circuit 32gq receives the signal potentials on nodes N1, N9 and N6. The signal potential on node N6 is logically complementary to the signal potential on node N5. Therefore, the output signal of AND circuit 32gp attains H-level in synchronization with rising of internal clock signal CLK in each of clock cycles #2 and #4.

Select circuit 32gr selects the output signal of AND circuit 32gp when CAS latency 4 designating signal MCL4 is, for example, at L-level indicating that the CAS latency is shorter than 4 clock cycles. Also, select circuit 32gr selects the output signal of AND circuit 32gq when the CAS latency is set to 4 and therefore CAS latency 4 designating signal MCL4 is, for example, at H-level. When the CAS latency is smaller than 4, the write buffer is reset in each clock cycle. When the CAS latency is set to 4, the write buffer is rest every two clock cycles.

Figure 18:
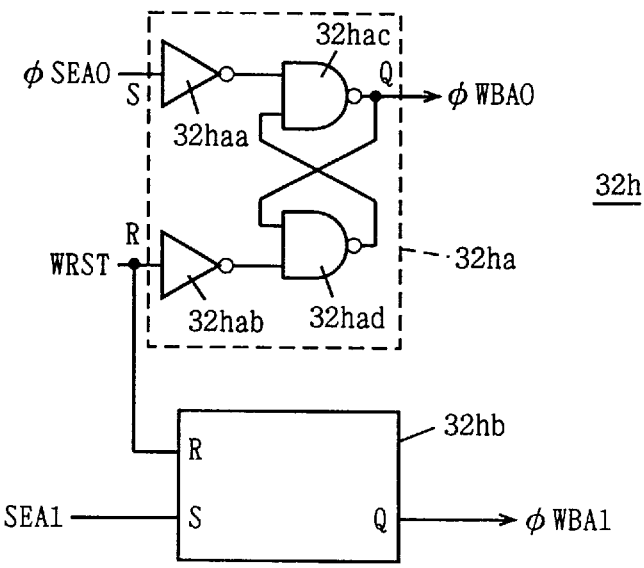
FIG. 18 shows a structure of a write buffer activating signal generating portion shown in FIG. 1.

FIG. 18 schematically shows a structure of a portion for generating the write buffer activating signal. In FIG. 18, write buffer activating signal generating portion 32h includes a write buffer control circuit 32ha responsive to select signal φSEA0 to generate write buffer activating signal φWBA0, and a write buffer control circuit 32hb which generates write buffer activating signal φWBA1 in accordance with select signal φSEA1. Since write buffer control circuits 32ha and 32hb have the same structures, FIG. 18 specifically shows the internal structure of write buffer control circuit 32ha.

Write buffer control circuit 32ha includes an inverter 32haa receiving select signal φSEA0, an inverter 32hab receiving reset signal WRST, a NAND circuit 32hac receiving an output signal of inverter 32haa at one input, and a NAND circuit 32had receiving an output signal of inverter 32hab at one input. An output signal of NAND circuit 32hac is applied to the other input of NAND circuit 32had. An output signal of NAND circuit 32had is supplied to the other input of NAND circuit 32hac.

Figure 19:
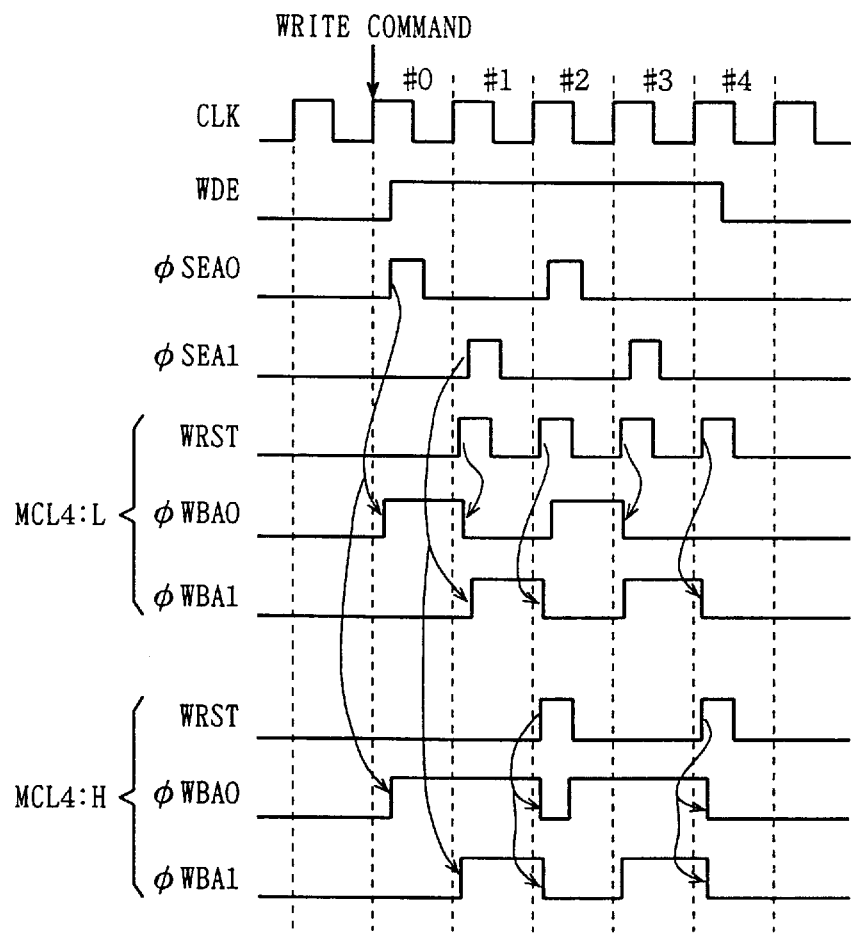
FIG. 19 is a timing chart representing an operation of the write buffer activating signal generating portion shown in FIG. 18.

NAND circuit 32hac generates write buffer activating signal φWBA0. Write buffer control circuit 32ha has a structure equivalent to set/reset flip-flop, and is set by select signal φSEA0 and is reset by reset signal WRST. An operation of the write buffer activating signal generating portion will be described below with reference to a timing chart of FIG. 19.

When the write command is applied in clock cycle #0, write operation activating signal WDE attains the active state of H-level in clock cycle #0. In accordance with activation of write operation activating signal WDE, select signals φSEA0 and φSEA1 are alternately driven to and kept for a predetermined period at the active state every clock cycle. When CAS latency is smaller than 4, CAS latency 4 designating signal MCL4 is set, for example, to the inactive state of L-level, and reset signal WRST is set to and kept for a predetermined period in the active state in each of clock cycles #1, #2, #3 and #4. In accordance with activation of select signal φSEA0, the output signal of inverter 32haa falls from H-level to L-level, and correspondingly write buffer activating signal φWBA0 generated from NAND circuit 32hac is driven to the active state of H-level.

In clock cycle #1, reset signal WRST stays in the active state of H-level for a predetermined period. Thereby, the output signal of NAND circuit 32had attains H-level, and write buffer activating signal φWBA0 from NAND circuit 32hac falls to L-level. In clock cycle #1, select signal φSEA1 is driven to the active state of H-level, and write buffer activating signal φWBA1 is activated. Control circuits 32ha and 32hb each are a flip-flop of a set-preference type, and are set in response to setting of select signal φSEA0 or φSEA1 to the active state of H-level even if reset signal WRST is at H-level. When control circuits 32ha and 32hb are set, the output signal, i.e., write buffer activating signal φWBA0 or fWBA1 is driven to the active state. When CAS latency is smaller than 4, therefore, write buffer activating signals φWBA0 and φWBA1 are alternately driven to the active state every clock cycle.

When the CAS latency is 4, reset signal WRST is activated one time during two cycles, and more specifically is activated in clock cycles #2 and #4. Write buffer activating signal φWBA0 is driven to the active state in accordance with activation of select signal φSEA0 in clock cycle #0. Write buffer activating signal φWBA1 is driven to the active state in accordance with activation of select signal φSEA1 in clock cycle #1.

In accordance with reset signal WRST in clock cycle #2, write buffer activating signals φWBA0 and φWBA1 are temporarily deactivated. In clock cycle #2, write buffer activating signal φWBA0 is driven to the active state again in accordance with select signal φSEA0. Then, write buffer activating signal φWBA1 is driven to the active state in accordance with select signal φSEA1 in clock cycle #3, and then write buffer activating signals φWBA0 and φWBA1 are driven to the inactive state in accordance with reset signal WRST in clock cycle #4. In select circuit 32gr (see FIG. 16), a generation period of the reset signal is changed in accordance with CAS latency 4 designating signal MCL4, whereby data writing can be performed in either the 2-bit prefetch mode or the pipelined mode.

Figure 20:
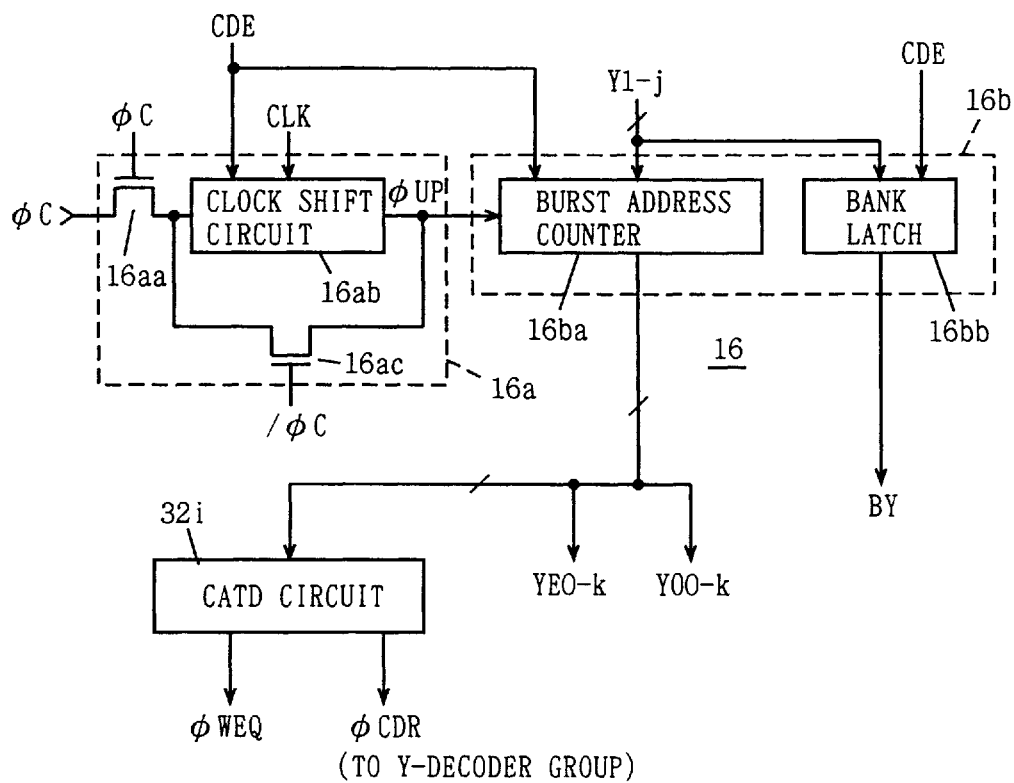
FIG. 20 schematically shows structures of a Y-address operation circuit and a peripheral control portion shown in FIG. 2.

FIG. 20 schematically shows a structure of Y-address operation circuit 16 shown in FIG. 2. In FIG. 20, Y-address operation circuit 16 includes an address control circuit 16a which takes in column-related activating signal φC, and generates a count-up signal φUP every 2 clock cycles in accordance with internal clock signal CLK, and an address generating circuit 16b which is made active when column-related enable signal CDE is active, and generates the internal column address signal by taking in internal column address signal Y1–Yj applied from the Y-address buffer shown in FIG. 2 and changing these address in accordance with count-up signal φUP from address control circuit 16a.

Address control circuit 16a includes a transfer gate 16aa which is turned on in response to activation of column-related activating signal φC, and passes column-related activating signal φC, a 2-clock shift circuit 16ab which is activated in response to activation of column-related enable signal CDE, and shifts the signal transmitted from transfer gate 16aa in accordance with internal clock signal CLK, and a transfer gate 16ac which is turned on in response to deactivation of column-related activating signal φC, and transmits the output signal of 2-clock shift circuit 16ab to an input of 2-clock shift circuit 16ab. Two-clock shift circuit 16ab is formed of shift registers of two stages (see FIG. 16), and delays the signal received on its input by two clock cycles for outputting.

Address generating circuit 16b includes a burst address counter 16ba which is made active when column-related enable signal CDE is active, and takes in address signal Y1–Yj from the Y-address buffer for changing the output values thereof in a predetermined sequence in accordance with count-up signal φUP from address control circuit 16a, and a bank latch 16bb which latches the address signal applied from the Y-address buffer in accordance with column-related enable signal CDE and generates bank address signal BY.

Burst address counter 16ba generates internal column address signals YE0–YEk and YO0–YOk to Y-decoder groups 4aa and 4ab shown in FIG. 1, respectively.

Figure 21:
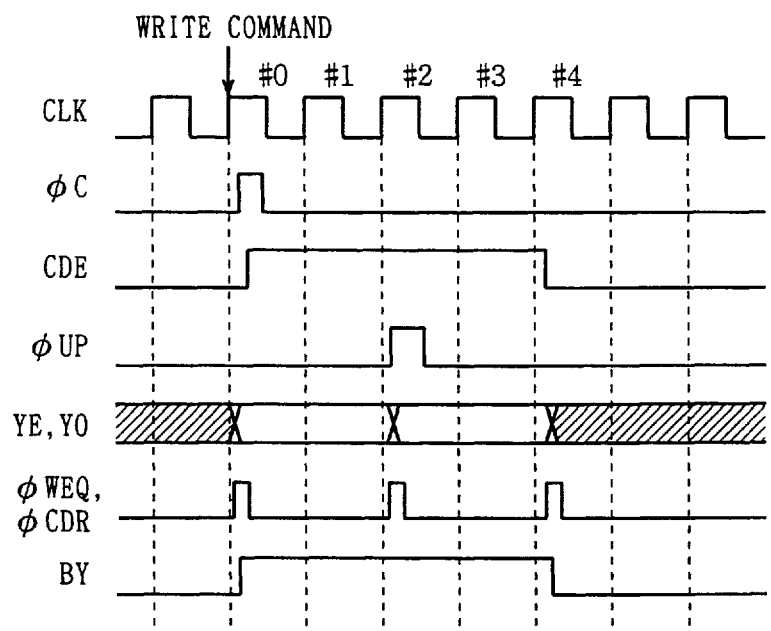
FIG. 21 is a timing chart representing an operation of a circuit shown in FIG. 20.

The internal column address signals from burst address counter 16ba are applied to column address change detection signal (CATD) circuit 32i included in control signal generating circuit 32 shown in FIG. 2. Column address change detecting circuit 32i detects the change in the internal column address signal from burst address counter 16ba, and generates internal data bus equalize instructing signal φWEQ and column decoder (Y-decoder) reset signal φCDR. Then, an operation of the Y-address operation circuit shown in FIG. 20 will be described below with reference to a timing chart of FIG. 21.

In clock cycle #0, the write command is applied. In accordance with this write command, column-related activating signal #C is driven to H-level for a predetermined period, and transfer gate 16aa in address generating circuit 16a is turned on to transmit the signal at H-level to the input of 2-clock shift circuit 16ab. Column-related enable signal CDE is activated in accordance with this write command, and burst address counter 16ba is activated to take in the internal address signal from the Y-address buffer and generate internal column address signals YE0–YEk and YO0–YOk. Bank latch 16bb takes in the applied bank address signal and generates bank address signal BY in accordance with column-related enable signal CDE.

In accordance with generation of the internal column address signal from burst address counter 16ba, column address change detection circuit 32i detects this change, and generates data bus equalize instructing signal φWEQ and column decoder reset instructing signal φCDR each of the form of one-shot pulse. Thereby, the column selection takes place in memory arrays 1aa and 1ab shown in FIG. 1, and the selected columns are connected to the internal data buses.

In clock cycle #1, output signal φUP of 2-clock shift circuit 16ab is still at L-level, and the internal column address signal from burst address counter 16ba does not change.

When 2 clock cycles elapses after application of the write command, count-up signal φUP from 2-clock shift circuit 16ab is activated in clock cycle #2, and change occurs in values of internal column address signals YE0–YEk and YO0–YOk from burst address counter 16ba. In accordance with change in the internal column address signals from burst address counter 16ba, internal data bus equalize signal φWEQ and column decoder reset signal φCDR from column address change detection circuit 32i attain the active state for a predetermined period again.

The column selection takes place again in accordance with the new internal column address signal. Upon elapsing of 4 clock cycles designated by the burst length data, column-related enable signal CDE falls in clock cycle #4, and 2-clock shift circuit 16ab and bank latch 16bb are reset and restored to the initial state. In response to change of the internal column address signal to the reset state, internal data bus equalize instructing signal φWEQ and column decoder reset signal φCDR attain the active state of H-level for a predetermined period again.

Column-related enable signal CDE can be achieved by using a structure similar to that of the circuit shown in FIG. 13. Column-related enable signal CDE changes at an earlier timing than write operation activating signal WDE.

Figure 22:
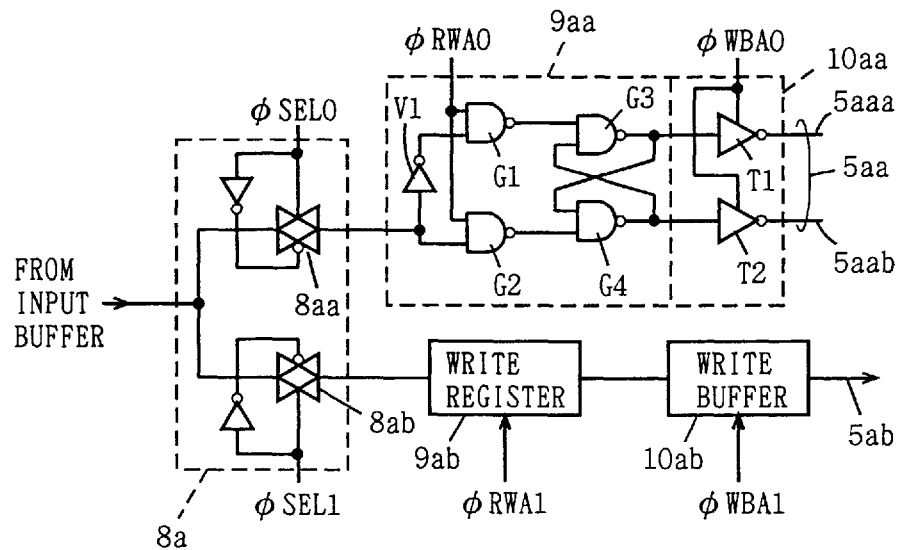
FIG. 22 illustrates structures of portions at a data write path shown in FIG. 1.

FIG. 22 schematically shows a structure of a write path for bank A shown in FIG. 1. FIG. 22 specifically shows a circuit structure for memory array 1aa. Since the data writing portion for memory array 1ab has the same structure, it is represented merely by a block.

In FIG. 22, selector 8a includes a transmission gate 8aa which is turned on in response to H-level of select signal φSEA0 and transmits the write data applied from the input buffer, and a transmission gate 8ab which is turned on in response to H-level of select signal φSEA1 and transmits the data applied from the input buffer. The data transmitted by transmission gate 8aa is applied to write register 9aa, and the data transmitted by transmission gate 8ab is applied to write register 9ab.

Write register 9aa includes an inverter V1 which inverts the data applied from transmission gate 8aa, a NAND circuit G1 which receives an output signal of inverter V1 and register activating signal φRWA0, a NAND gate G2 which receives the data from transmission gate 8aa and register activating signal φRWA0, and NAND circuits G3 and G4 which latch output signals of NAND circuits G1 and G2, respectively. NAND circuit G3 has one input receiving the output signal of NAND circuit G1, and another input receiving an output signal of NAND circuit G4. NAND circuit G4 receives the output signal of NAND circuit G2 at one input thereof, and also receives an output signal of NAND circuit G3 at the other input thereof.

In write register 9aa, NAND circuits G1 and G2 operate as inverters when register activating signal φRWA0 is in the active state of H-level, and takes in and latches the data from the selector. When register activating signal φRWA0 attains L-level, the output signals of NAND circuits G1 and G2 attain H-level, and the latch circuit formed of NAND circuits G3 and G4 attains the latch state for latching and outputting the received data.

Write buffer 10aa includes tristate inverter buffers T1 and T2 which are activated in response to activation of write buffer activating signal φWBA0, and transmit the output signals of NAND circuits G3 and G4 onto internal data bus lines 5aaa and 5aab after inverting and amplifying them, respectively. Internal data bus lines 5aaa and 5aab form internal data bus 5aa, and transmit data signals which are complementary to each other. Write buffer 10aa attains the output high impedance state when activating signal φWBA0 attains the inactive state of L-level.

A structure similar to that shown in FIG. 22 is provided for bank B. Although the structure for bank A has been described, bank B employs a similar structure, and selective activation takes place in accordance with bank address signals BY and /BY.

According to the embodiment 1 of the invention, as described above, the data writing methods are selectively set using the CAS latency designating signal set in the mode register. Therefore, a user can operate the SDRAM in the optimum data write mode according to the operation environment without awareness of the internal data write method.

Embodiment 2

Figure 23:
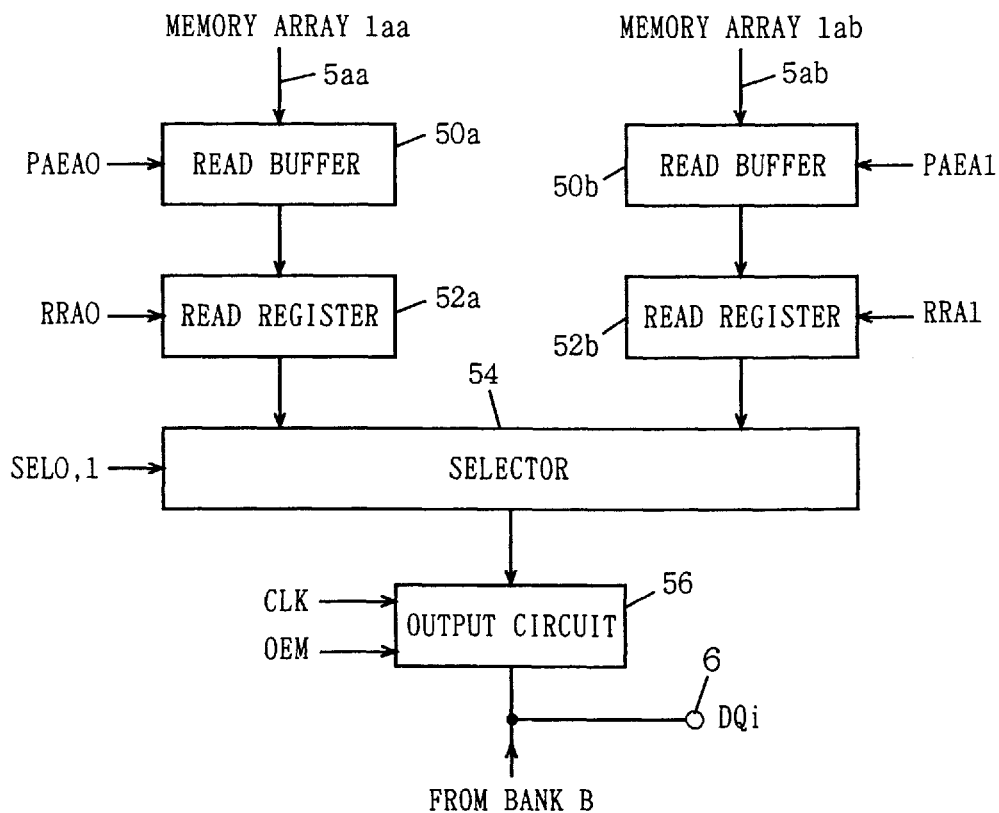
FIG. 23 schematically shows a structure of a data read portion of a semiconductor memory device according to an embodiment 2 of the invention.

FIG. 23 schematically shows a structure of a main portion of an SDRAM according to an embodiment 2 of the invention. FIG. 23 shows a structure of a data reading portion for bank A. The same structure as that shown in FIG. 23 is employed in a data reading portion for bank B. Structures of memory arrays 1aa and 1ab as well as their peripheral circuitry included in bank A are similar to those already described and shown in FIGS. 1 and 2.

In FIG. 23, the data read portion includes a read buffer 50a which is made active when a read buffer activating signal PAEA0 is active, and amplifies data read from memory array 1aa onto internal data bus 5aa for outputting, a read register 52a which takes in and latches an output signal of read buffer 50a in response to activation of a register activating signal RRA0, a read buffer 50b which is activated in response to activation of a read buffer activating signal PAEA1, and amplifies data read from memory array 1ab onto internal data bus 5ab, a read register 52b which takes in and latches an output signal of read buffer 50b in response to activation of register activating signal RRA1, a selector 54 which selects latched data of read register 52a or 52b in accordance with a select signal SEL, and an output circuit 56 which is activated in response to activation of an output enable signal OEM, and takes in data applied from selector 54 for outputting to data input/output terminal 6 in synchronization with internal clock signal CLK.

Output circuit 56 is internally provided with a latch circuit, and takes in the data applied from selector 54 in synchronization with internal clock signal CLK for subsequently latching and outputting the data when output activating signal OEM is active. An operation of the data reading portion shown in FIG. 23 will be described below with reference to timing charts of FIGS. 24 and 25.

Figure 24:
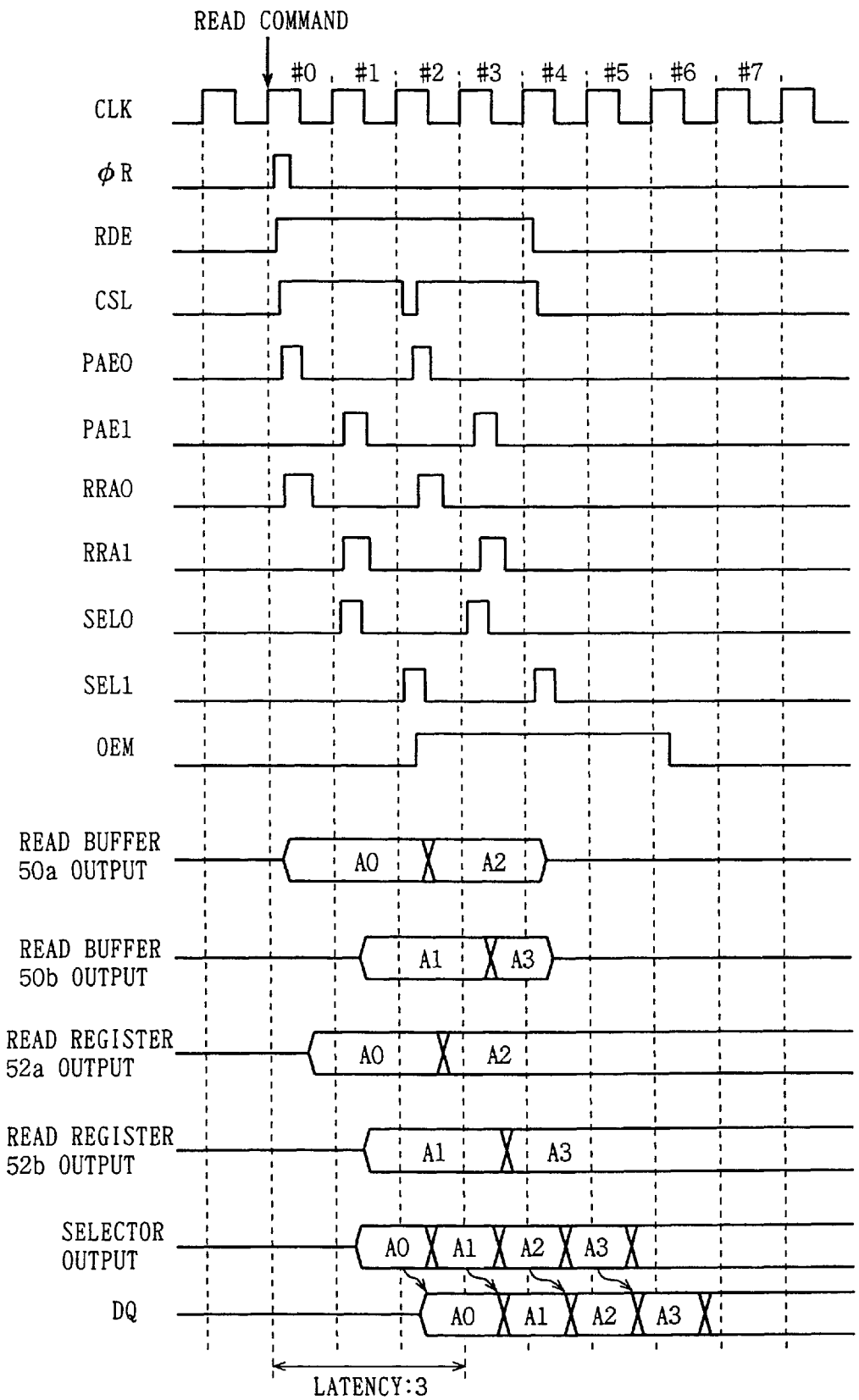
FIG. 24 is a timing chart representing a data read operation performed with a CAS latency of 3 by the semiconductor memory device according to the embodiment 2 of the invention.

With reference to FIG. 24, description will now be given on the data read operation in the case that the CAS latency is set to 3. In this data reading operation described below, it is assumed that the burst length is 4, the lowest column address signal Y0 is set to "0", and a column in memory array 1aa is designated.

As shown in FIG. 24, the read command is applied in clock cycle #0, so that control signal generating circuit 13 shown in FIG. 2 generates read operation instructing signal φR (i.e., this signal is activated). In accordance with activation of this read operation instructing signal φR, read operation activating signal RDE is set to H-level for the burst length period. In accordance with this read operation instructing signal φR, the column selection is performed in accordance with the currently applied column address signal, and corresponding column select line CSL is driven to the selected state. In clock cycle #0 in which the read command is applied, read buffer activating signal PAE0 is first activated, and read buffer 50a is activated to amplify and output the data on internal data bus 5aa. In response to activation of read buffer activating signal PAEA0, register activating signal RRA0 is then activated, and read register 52a takes in and latches the data applied from read buffer 50a. In clock cycle #0, therefore, read register 52a stores data A0 read from memory array 1aa.

Then, read buffer activating signal PAEA1 is activated in clock cycle #1, so that read buffer 50b is activated to amplify the data read from memory array 1ab for application to read register 52b. Read register 52b is activated in response to activation of register activating signal RRA1, and takes in the data applied from read buffer 50b for latching. In clock cycle #1, therefore, the output data of read register 52b forms data A1 read from memory array 1ab. In clock cycle #1, a select signal SEL0 in select signal SEL is activated, so that data stored in read register 52a is selected and output. In clock cycle #1, therefore, the output signal of selector 54 forms data A0. Output enable signal OEM is still inactive, and output circuit 56 does not take in the data.

In next clock cycle #2, the column selecting portion is once reset, and another column is driven to the selected state in accordance with a burst address from Y-address operation circuit (see FIG. 2). In this clock cycle #2, read buffer activating signal PAEA0 is driven to the active state again after completion of the column select operation, and then register activating signal RRA0 is driven to the active state.

In clock cycle #2, therefore, the data stored in read register 52a changes into data A2 which is newly read out. In clock cycle #2, output enable signal OEM rises to the active state, and output circuit 56 is activated to takes in data applied from selector 54 in synchronization with rising of internal clock signal CLK for latching and outputting. Therefore, output circuit 56 starts to output data A0 during clock cycle #2, and data A0 thus output will be made definite at the rising edge of internal clock signal CLK in clock cycle #3. Meanwhile, in clock cycle #2, selector 56 selects and outputs data stored in read register 52b in accordance with a next select signal SEL1. Output circuit 56 is provided with a latch circuit synchronized with internal clock signal CLK, and does not yet take in data A1 from selector 54.

In clock cycle #3, read buffer 50b is activated again in response to activation of read buffer activating signal PAEA1, and amplifies data read from memory array 1ab for application to read register 52b. Then, read register 52b takes in and latches data applied from read buffer 50b in response to activation of register activating signal RRA1. Therefore, data stored in read register 52b changes from data A1 into data A3 in clock cycle #3.

In this clock cycle #3, output circuit 56 takes in the output data of selector 54 in synchronization with rising of internal clock signal CLK for latching and outputting. Therefore, the output data of output circuit 56 changes from data A0 into data A1. In clock cycle #3, selector 54 selects and outputs the data stored in read register 52a in accordance with activation of select signal SEL0.

In clock cycle #4, selector 56 selects data A3 stored in read register 52b in accordance with select signal SEL1. In clock cycle #4, output circuit 56 takes in data subsequently applied from selector 54 for latching and outputting it as data A2. In clock cycle #5, output circuit 56 takes in and latches data applied from selector 54 at the rising edge of internal clock signal CLK during clock cycle #5, so that the output data changes from data A2 into data A3. Thus, output circuit 56 generates the data which is definite at the rising edges of the internal clock signal (external clock signal) over clock cycles #3 through #6.

Since three clock cycles are required from application of the read command to output of first valid data, the CAS latency is 3. When the CAS latency is 3, data reading is also performed in the pipelines manner, so that read buffers 50a and 50b are alternately activated for successive transmission in accordance with internal clock signal CLK.

Figure 25:
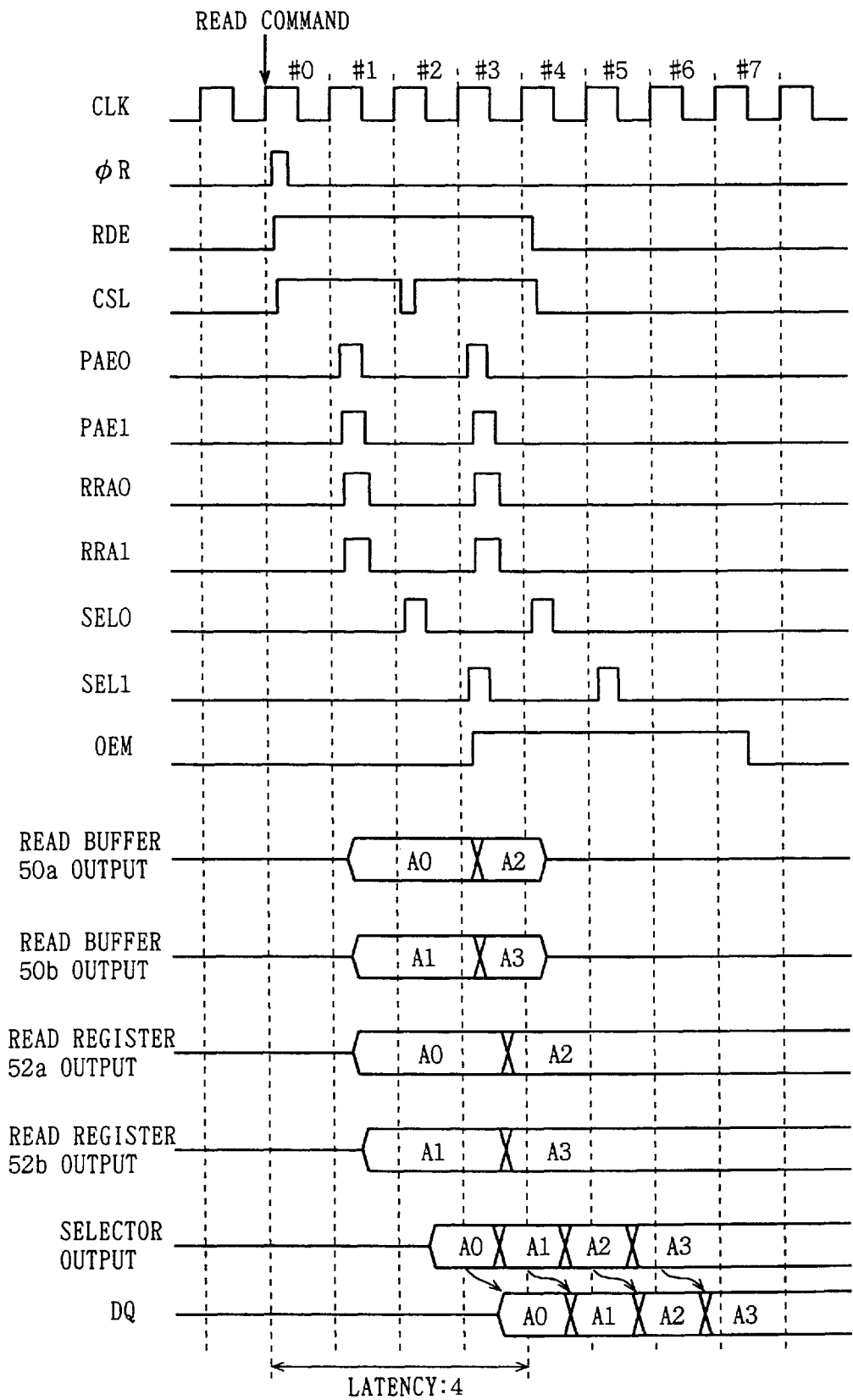
FIG. 25 is a timing chart representing a data read operation performed with a CAS latency of 4 by the semiconductor memory device shown in FIG. 23.

Referring to FIG. 25, an operation with the CAS latency of 4 will be described below.

In clock cycle #0, the read command is applied, and read operation instructing signal φR is set at the active state of H-level for a predetermined period, so that read operation activating signal RDE is set at the active state of H-level for a burst length period. In response to activation of read operation activating signal RDE, column selection takes place using, as a column address signal, the address signal applied simultaneously with the read command, so that corresponding column select signal CSL attains the active state of H-level.

When the CAS latency is 4, read buffers 50a and 50b are not activated in clock cycle #0 in which this read command is applied.

In clock cycle #1, read buffer activating signal PAEA0 and PAEA1 as well as register activating signals RRA0 and RRA1 are activated, so that data which are read from memory arrays 1aa and 1ab onto internal data buses 5aa and 5ab, respectively, are amplified and latched. Thereby, data stored in read registers 52a and 52b are formed of data A0 and A1 read from memory arrays 1aa and 1ab, respectively.

In clock cycle #2, select signal SEL0 is made active for a predetermined period, and data stored in read register 52a is selected by selector 54 and is applied to output circuit 56. In clock cycle #2, output enable signal OEM is still inactive and at L-level, and the output circuit 56 does not take in data.

In clock cycle #2, selection of a new column takes place in accordance with the burst address.

In clock cycle #3, read buffer activating signals PAEA0 and PAEA1 are activated again, and new data read from memory arrays 1aa and 1ab are amplified. Then, the data thus amplified are stored in read registers 52a and 52b in accordance with activation of register activating signals RRA0 and RRA1, respectively. Thereby, data stored in read registers 52a and 52b change into data A2 and A3 in clock cycle #3, respectively.

In clock cycle #3, select signal SEL1 is activated, and selector 54 selects and outputs data A1 stored in read register 52b. In clock cycle #3, output enable signal OEM attains H-level, and output circuit 56 takes in and latches data A0 which is applied from selector 54 in clock cycle #3 for outputting. Therefore, data A0 from output circuit 56 is made definite at the rising edge of clock signal CLK in clock cycle #4.

In each of clock cycles #4 and #5, select signals SEL0 and SEL1 is made active for a predetermined period, so that selector 56 successively selects and outputs data A2 and A3 stored in read registers 52a and 52b, respectively. When output enable signal OEM is active, output circuit 56 takes in and latches the data applied from selector 56 in synchronization with the rising of internal clock signal CLK for outputting. Therefore, data A1, A2 and A3 become definite in clock cycles #5, #6 and #7 respectively.

Through a series of operations described above, the so-called 2-bit prefetch operation can be performed for successively reading out the data when the CAS latency is set to 4.

In the operation sequence shown in FIG. 25, register activating signals RRA0 and RRA1 are simultaneously activated in accordance with read buffer activating signals PAE0 and PAE1, respectively. However, read register activating signals RRA0 and RRA1 may be alternately activated every clock cycle, as shown in FIG. 24.

In clock cycle #7, output enable signal OEM is deactivated because required data of the burst length of 4 bits have been read out. Structures of various portions will be briefly described below.

Figure 26:
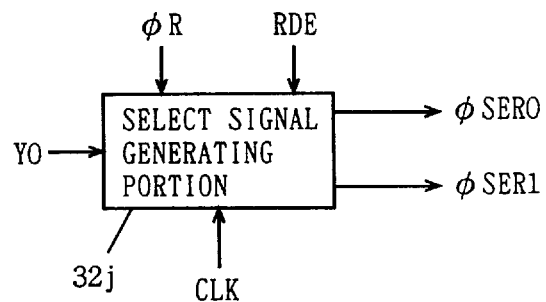
FIG. 26 schematically shows a structure of a select signal generating portion in the semiconductor memory device of the embodiment 2 of the invention.

FIG. 26 schematically shows a structure of a select signal generating portion. In FIG. 26, select signal generating portion 32j takes in internal column address signal bit Y0 in accordance with activation of read operation instructing signal φR, and then is made active for an active period of read operation activating signal RDE to successively perform transfer operations in accordance with internal clock signal CLK to generate basic select signals φSER0 and φSER1.

Select signal generating portion 32j has the same internal structure as the structure shown in FIG. 11. Select signal generating portion 32j determines which of memory arrays 1aa and 1ab is to be selected first based on the lowest bit Y0 of the address signal. When the lowest address bit Y0 is "0", basic select signal φSER0 is activated first. When bit Y0 is "1", signal φSER1 is activated first.

Figure 27A:
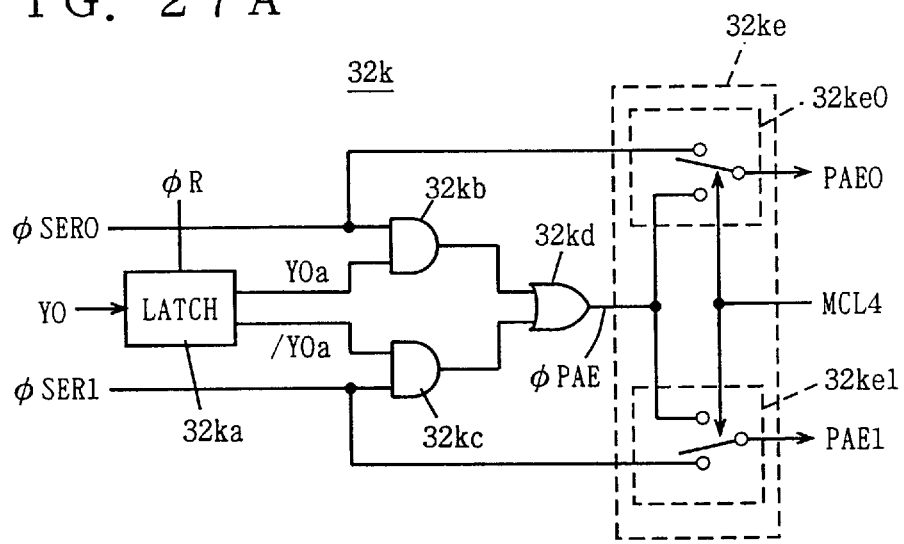
FIG. 27A shows a structure of a read buffer activating signal generating portion in the semiconductor memory device of the embodiment 2 of the invention.

FIG. 27A schematically illustrates a structure of a read buffer activating signal generating portion 32k. In FIG. 27A, read buffer activating signal generating portion 32k includes a latch 32ka which latches the lowest address signal bit Y0 in response to activation of read operation instructing signal φR, an AND circuit 32kb which receives basic select signal φSER0 and an output signal YOa of latch 32ka, an AND circuit 32kc which receives an inverted bit /YOa from latch 32ka and basic select signal φSER1, an OR circuit 32kd which receives output signals of AND circuits 32kb and 32kc, and a mode setting circuit 32ke which selects basic select signals φSER0 and φSER1 or an output signal φPAE of OR circuit 32kd.

Figure 27B:
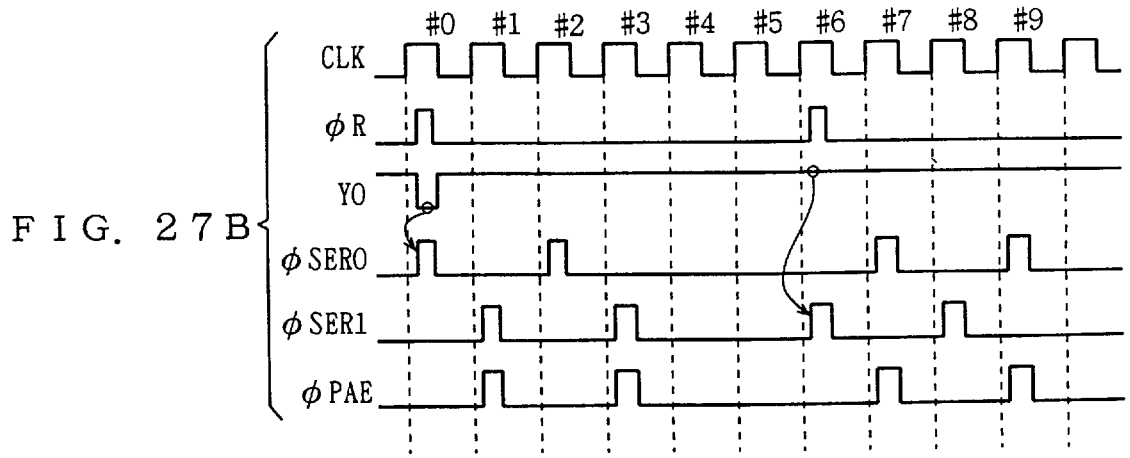
FIG. 27B is a timing chart representing operations of circuits shown in FIG. 27A.

Mode setting circuit 32ke includes a select circuit 32ke0 which selects either of basic select signal φSER0 and output signal φPAE of OR circuit 32kd in accordance with CAS latency 4 designating signal MCL4, and a select circuit 32ke1 which selects either of basic select signal φSER1 and signal φPAE in accordance with CAS latency 4 designating signal MCL4. Select circuit 32ke0 generates read buffer activating signal φPAE0, and select circuit 32ke1 generates read buffer activating signal PAE1. Select signals 32ke0 and 32ke1 select signal φPAE from OR circuit 32kd if signal MCL4 indicates that the CAS latency is 4, and otherwise selects basic select signals φSER0 and φSER1. Then, an operation of the read buffer activating signal generating portion shown in FIG. 27A will be described below with reference to a timing chart of FIG. 27B.

In clock cycle #0, the read command is applied, so that read operation instructing signal φR is activated, and latch 32ka latches the bit Y0. If bit Y0 in clock cycle #0 is "0" (L-level), basic select signal φSER0 is activated in clock cycle #0. An output signal YOa of latch 32ka is at L-level, signal /YOa is at H-level, and the output signal of AND circuit 32kb is at L-level. Also, AND circuit 32kc is enabled. Therefore, output signal φPAE of OR circuit 32kd maintains L-level in clock cycle #0.

In clock cycle #1, basic select signal φSER1 enters the active state of H-level for a predetermined period. Therefore, the output signal of AND circuit 32kc likewise rises to H-level, and signal φPAE attains H-level for a predetermined period in clock cycle #1.

In clock cycle #2, basic select signal φSER0 attains H-level for a predetermined period, so that the output signal of AND circuit 32kd is at L-level, and signal φPAE is not generated (i.e., is not activated).

In clock cycle #3, basic select signal φSER1 enters the active state of H-level for a predetermined period again, so that signal φPAE is activated to attain H-level through AND circuit 32kc and OR circuit 32kd.

When burst length is 4, the operation of internally reading out 4-bit data is completed in clock cycle #3.

In clock cycle #6, the read command is applied again, and read operation instructing signal φR becomes the active state of H-level for a predetermined period. When the lowest column address signal bit Y0 is set to H-level ("1") in this state, basic select signal φSER1 is made active for a predetermined period in clock cycle #6. In this state, output signal YOa of latch 32ka is at H-level, and signal /YOa is at L-level. Therefore, the output signal of AND circuit 32kc is fixed at L-level, and AND circuit 32kb is enabled to operate as an buffer.

In clock cycle #7, basic select signal φSER0 attains the active state of H-level for a predetermined period in synchronization with rising of internal clock signal CLK. Thereby, signal φPAE attains the active state of H-level owing to AND circuit 32kb and OR circuit 32kd.

In clock cycle #8, basic select signal φSER1 attains H-level. Signal φPAE maintains L-level owing to AND circuit 32kb.

In clock cycle #9, basic select signal φSER0 is activated again, so that signal φPAE enters the active state of H-level for a predetermined period owing to provision of AND circuit 32kb and OR circuit 32kd.

Mode setting circuit 32ke selects signal φPAE or signals φSER0 and SER1 in accordance with CAS latency 4 designating signal MCL4. If the CAS latency is set to 4, therefore, read buffer activating signals PAE0 and PAE1 are output in accordance with signal φPAE. If not, read buffer activating signals PAE0 and PAE1 are activated in accordance with basic select signals φSER0 and φSER1.

As described above, the data read mode can be set to either the 2-bit prefetch method or the pipelined method in accordance with the CAS latency information.

Figure 28:
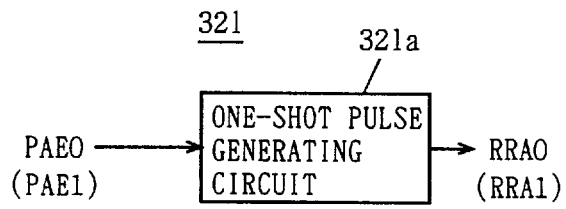
FIG. 28 schematically shows a structure of a read register activating signal generating portion shown in FIG. 23.

FIG. 28 schematically shows a structure of the read register activating signal generating portion. Since read register activating signals RRA0 and RRA1 are generated by similar circuit structures, FIG. 28 shows only the structure for read register activating signal RRA0.

In FIG. 28, a read register activating signal generating portion 321 includes a one-shot pulse generating portion 321a which generates a pulse of one shot having a predetermined time width in response to activation of read buffer activating signal PAE0. One-shot pulse generating portion 321a generates read register activating signal RRA0. Read register activating signal RRA1 is generated from a one-shot pulse generating portion provided for read buffer activating signal PAE1.

As shown in FIG. 28, the read register activating signal is generated in accordance with the read buffer activating signal, and the read register activating signal can be easily produced in accordance with the data transfer mode.

Figure 29:
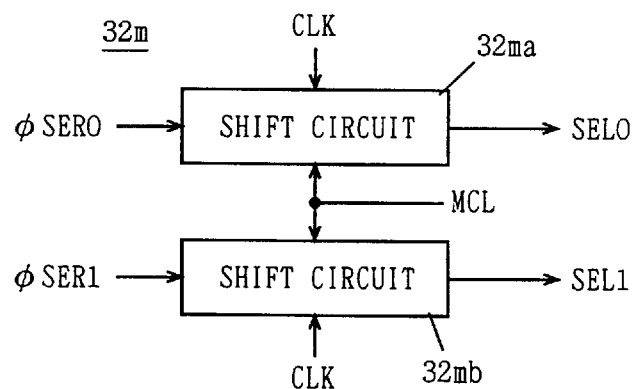
FIG. 29 schematically shows a structure of a portion generating a select signal applied to a selector shown in FIG. 23.

FIG. 29 schematically shows a structure of a select signal generating portion. In FIG. 29, a select signal generating portion 32m includes a shift circuit 32ma which shifts basic select signal φSEL0 in accordance with internal clock signal CLK, and a shift circuit 32mb which successively shifts basic select signal φSEL1 in accordance with internal clock signal CLK. The number of shifts in each of shift circuits 32ma and 32mb depends on CAL latency designation data MCL. When the CAS latency is set to 4, shift circuits 32ma and 32mb delay basic select signals φSER0 and φSER1 by two clock cycles, respectively. When the CAS latency is set to 3, shift circuits 32ma and 32mb delay basic select signals φSER0 and φSER1 by one clock cycle, respectively. Each of shift circuits 32ma and 32mb is formed of shift circuits of multiple stages, of which number is determined by CAS latency data MCL. Thereby, necessary data can be produced from the selector at the CAS latency-1 clock cycle counting from application of read command in accordance with the CAS latency data.

Figure 30:
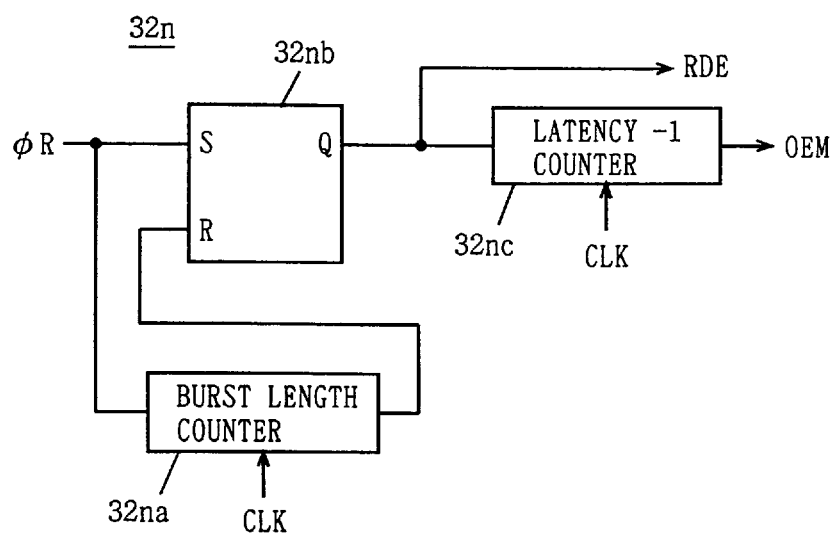
FIG. 30 schematically shows a structure of an output enable signal generating portion shown in FIG. 23.

FIG. 30 schematically shows a structure of a portion generating output enable signal OEM and read operation activating signal RDE. In FIG. 30, the control signal generating portion includes a burst length counter 32na which is started in response to activation of read operation instructing signal φR, and counts the internal clock signal CLK to the number represented by the burst length, a set/reset flip-flop 32nb which is set in response to activation of read operation instructing signal φR, and is reset in response to a count-up signal of burst length counter 32na, and a latency-1 counter 32nc which performs a shifting operation for delaying an output signal of set/reset flip-flop 32nb by a (latency-1) cycle in accordance with internal clock signal CLK for outputting.

Set/reset flip-flop 32nb generates read operation activating signal RDE from its output Q, and latency-1 counter 32nc generates output enable signal OEM. Thus, output enable signal OEM is produced by delaying read operation activating signal RDE by the latency-1 clock cycle, and stays active for the burst length period starting from the cycle immediately preceding the clock cycle represented by the latency.

According to the embodiment 2 of the invention, as described above, the data reading portion also has such a structure that either the pipelined type or the 2-bit prefetch type is automatically selected in accordance with the CAS latency information. Therefore, a user can operate the SDRAM in the optimum mode corresponding to the operation environment without awareness of the internal data reading method, and the SDRAM can be user-friendly.

Embodiment 3

Figure 31:
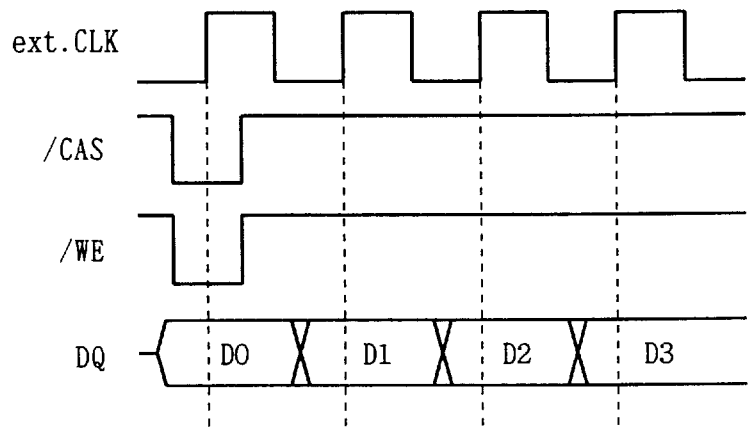
FIG. 31 is a timing chart showing a data write operation with a single data rate.

FIG. 31 is a timing chart showing a first data write mode of an SDRAM according to an embodiment 3 of the invention. In this first write mode, as shown in FIG. 31, write data D0, D1, D2 and D3 are successively taken in and stored in synchronization with the rising edges of external clock signal extCLK. Thus, data transfer is performed utilizing only the rising edges of external clock signal extCLK. This data transfer is called a "single data rate".

Figure 32A:
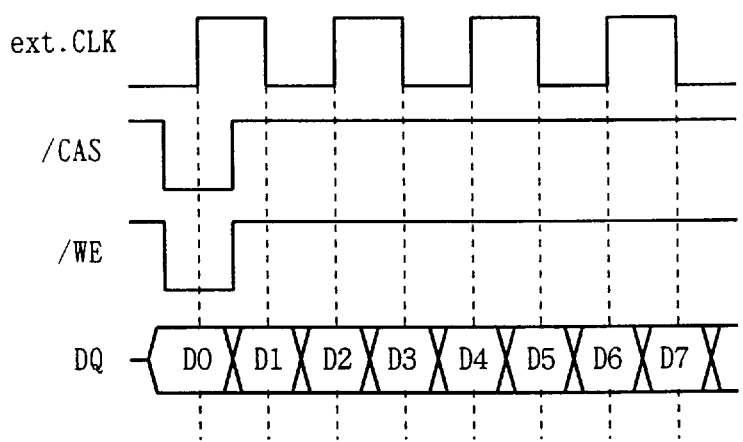
FIGS. 32A and 32B show data write timings with a double data rate, respectively.

FIG. 32A shows a second data write mode of the SDRAM according to the embodiment 3 of the invention. As shown in FIG. 32A, the duty ratio of external clock signal extCLK is 50%, and writing of data is performed utilizing the rising and falling edges of external clock signal extCLK. Therefore, write data D0–D7 are written at double the speed of external clock signal extCLK. Thus, the data transfer takes place at double the speed of external clock signal extCLK. This data transfer is called a "double data rate".

Figure 32B:
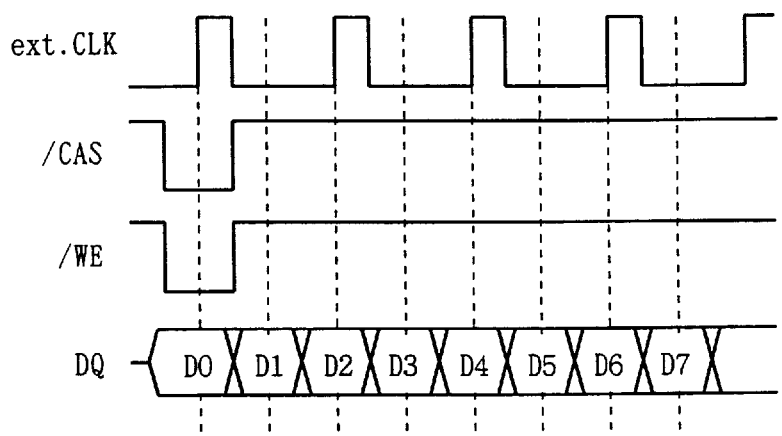

FIG. 32B shows another example of the double data rate data transfer. In FIG. 32B, the duty ratio of external clock signal extCLK is smaller than 50%. Data transfer is performed utilizing the rising edge of external clock signal extCLK and a center between two neighboring rising edges. In the data transfer shown in FIG. 32B, therefore, the data transfer can be performed at double the speed of external clock signal extCLK. These single and double data rates are employed in both the data writing and data reading.

Figure 33:
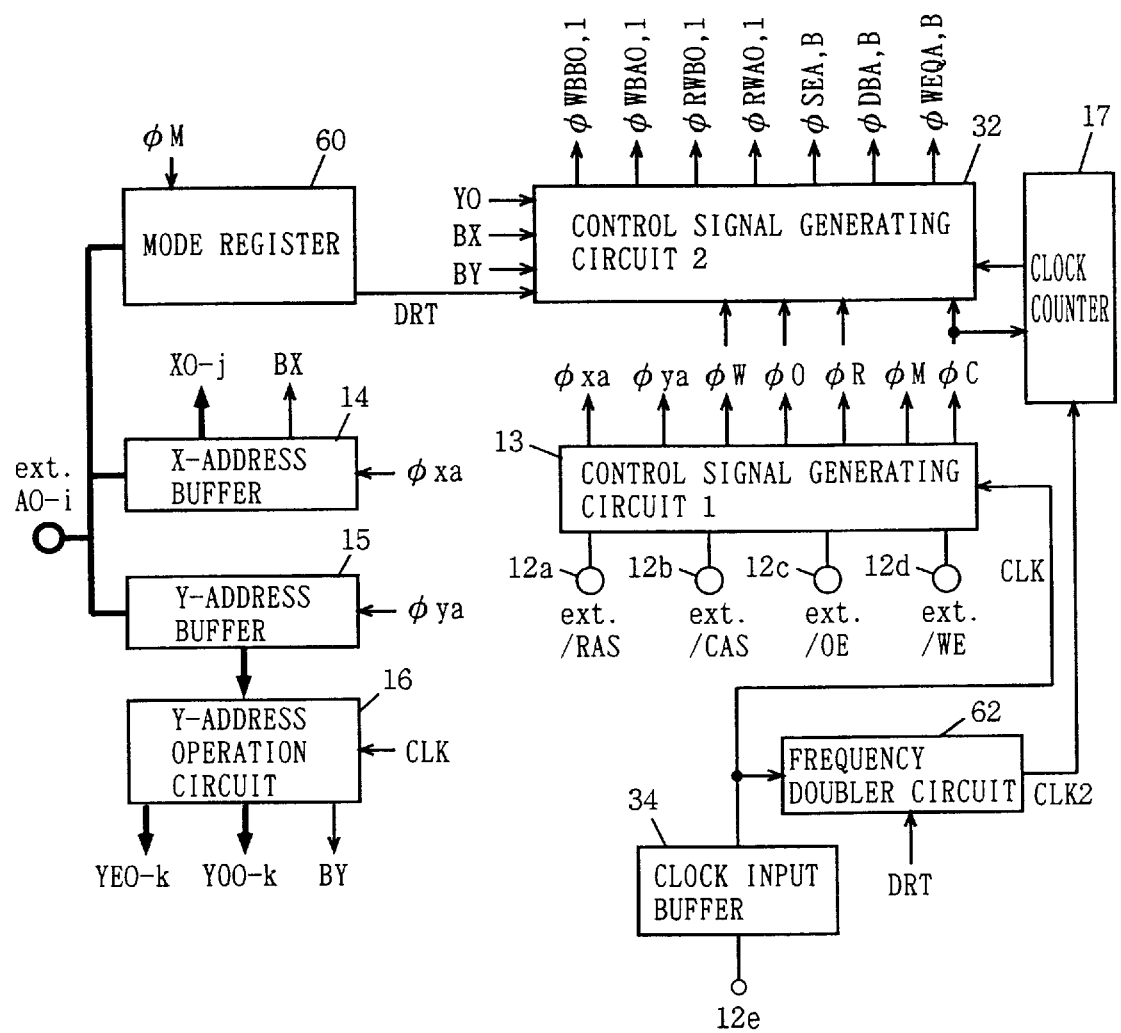
FIG. 33 schematically shows a structure of peripheral circuitry in a semiconductor memory device according to an embodiment 3 of the invention.

FIG. 33 schematically shows a structure of peripheral circuitry of the SDRAM according to the embodiment 3 of the invention. The memory array of the SDRAM according to the embodiment 3 of the invention is the same as that shown in FIG. 1.

In FIG. 33, the SDRAM includes a frequency doubler circuit 62 which doubles the frequency of internal clock signal CLK from clock input buffer 34. Other structures are the same as those shown in FIG. 2, and corresponding portions bear the same reference numerals.

An internal clock signal CLK2 from frequency doubler circuit 62 is applied to clock counter 17 and Y-address operation circuit 16. Frequency doubler circuit 62 buffers and outputs the clock signal from clock input buffer 34, when data rate designating signal DRT represents the single data rate. When data rate designating signal DRT represents the double data rate, frequency doubler circuit 62 is activated to produce internal clock signal CLK2 by doubling the frequency of the internal clock signal applied from clock input buffer 34. When Y-address operation circuit 16 operates in accordance with doubled internal clock signal CLK2, the count cycle of the burst address counter provided therein is double the cycle in the structures of the foregoing embodiments 1 and 2, and therefore the column select period decreases.

Likewise, when clock counter 17 operates in accordance with doubled internal clock signal CLK2, the burst length period and the CAS latency period are equal to halves of those in the embodiments 1 and 2.

Control signal generating circuit 32 operates in accordance with doubled internal clock signal CLK2 from frequency doubler circuit 62. Therefore, by replacing all the internal clock signals CLK in the embodiments 1 and 2 with doubled internal clock signal CLK2, such an SDRAM can be implemented that performs the column selection and data transfer at double the speed of the external clock signal.

Control signal generating circuit 32 switches the data transfer modes in accordance with data rate designating signal DRP stored in mode register 60. This data transfer designating signal DRT is used instead of CAS latency 4 designating signal MCL4 in the embodiments 1 and 2. Mode register 60 is the same as the register circuit storing the burst length data and the CAS latency data, and is activated in accordance with mode register set instructing signal φM to take in a predetermined bit of the external address signal for storing the same as the data rate designating signal.

Figure 34:
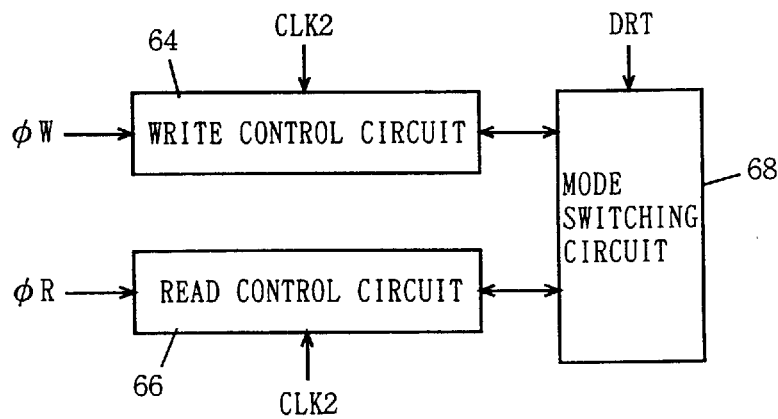
FIG. 34 conceptually shows an internal structure of a control signal generating circuit shown in FIG. 33.

FIG. 34 schematically shows circuit structures of control signal generating circuit 32 and clock counter 17 shown in FIG. 33. This control signal generating circuit includes a write control circuit 64 which is activated in accordance with write operation instructing signal φW, and generates internal control signals required for data writing in accordance with internal clock signal CLK2, a read control circuit 66 which is activated in response to activation of read operation instructing signal φR, and performs an operation required for data reading in synchronization with internal clock signal CLK2, and a mode switching circuit 68 which switches the data transfer methods of write control circuit 64 and read control circuit 66 in accordance with data rate designating signal DRT. Write control circuit 64 corresponds to the structure of the control signal generating portion in the embodiment 1 already described, and read control circuit 66 corresponds to the structure of the internal control signal generating portion in the embodiment 2 already described. Mode switching circuit 68 corresponds to the mode setting circuits shown in FIGS. 16 and 27A.

Figure 35:
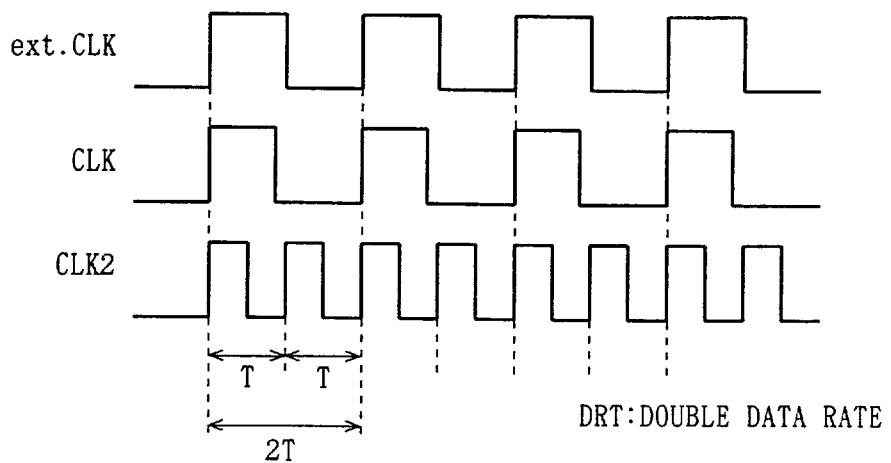
FIG. 35 is a signal waveform diagram representing an operation with a double data rate set by a doubler circuit shown in FIG. 33.

As shown in FIG. 35, when data rate designating signal DRT is set to the double data rate, frequency doubler circuit 62 is activated to produce doubled internal clock signal CLK2 by doubling the frequency of internal clock signal CLK. In this case, external and internal clock signals extCLK and CLK each have the period of 2T, and the doubled internal clock signal CLK2 has the period of T. Since both write control circuit 64 and read control circuit 66 operate in accordance with doubled internal clock signal CLK2, the data transfer is internally performed in synchronization with the rising of doubled clock signal CLK2, and input/output of data can be performed at the rising edge of external clock signal extCLK and the center between the neighboring rising edges of external clock signal extCLK.

Figure 36:
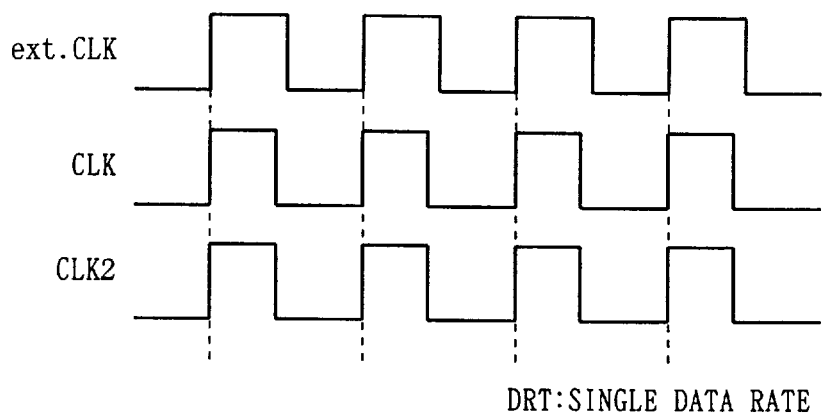
FIG. 36 is a signal waveform diagram representing an operation with a single data rate set by a doubler circuit shown in FIG. 33.
Figure 37:
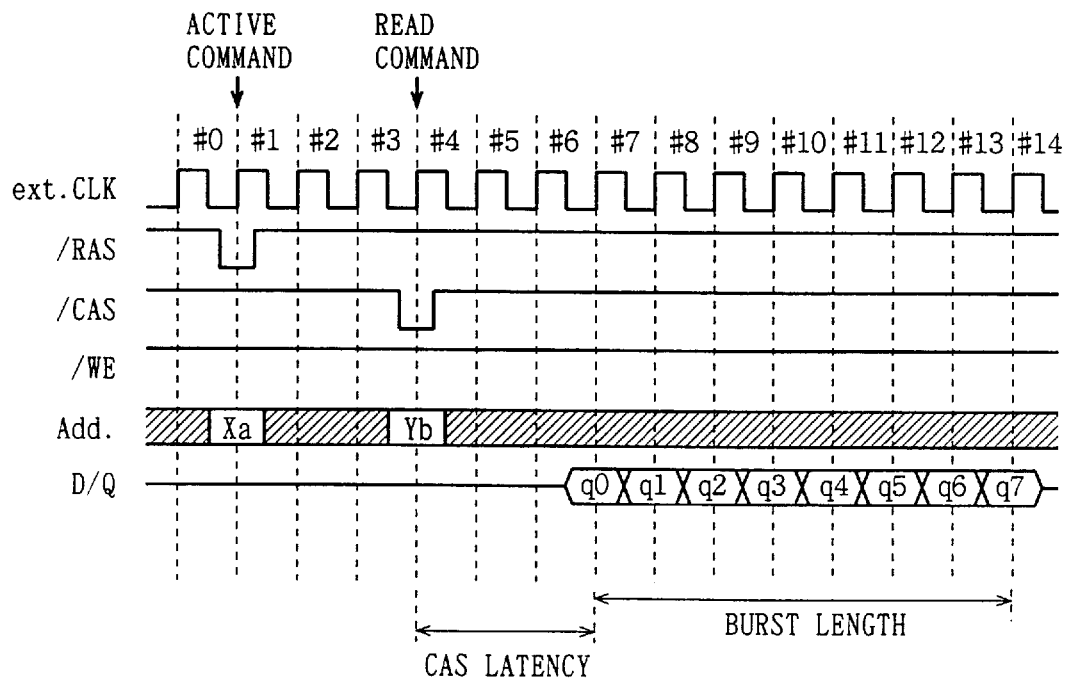
FIG. 37 is a timing chart representing a data read operation in a synchronous semiconductor memory device in the prior art.
Figure 38:
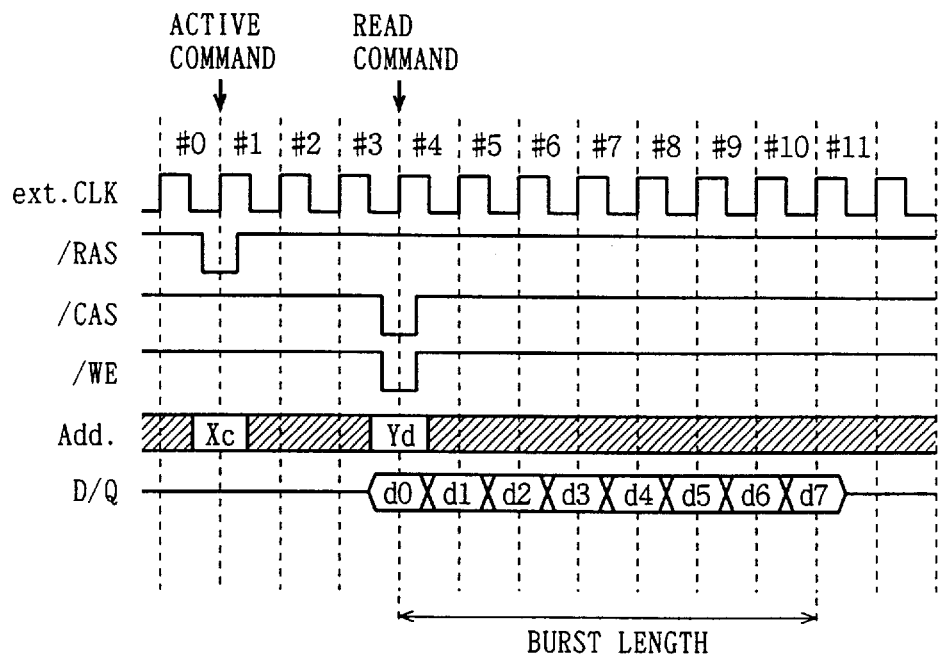
FIG. 38 is a timing chart representing a data write operation in the synchronous semiconductor memory device in the prior art.

When data rate designating signal DRT represents the single data rate as shown in FIG. 36, frequency doubler circuit 62 is inactive and passes internal clock signal CLK2. Therefore, internal clock signals CLK and CLK2 have the same frequency, and both reading control circuit 66 and write control circuit 64 perform the data transfer in synchronization with rising of internal clock signal CLK2 which is equal to internal clock signal CLK. With this single data rate, therefore, input and output of data are performed in synchronization with the rising edge of internal clock signal CLK2, so that input and output of data are performed only at the rising edge of external clock signal extCLK.

The structure capable of switching the data transfer modes can be implemented by using signal DRT instead of signal in the embodiments 1 and 2, and by using internal clock signal CLK2 instead of internal clock signal CLK. According to the embodiment 3 of the invention, as described above, the internal data transfer method is set in accordance with the data rate representing the data input/output speed. Therefore, a user can operate the SDRAM in the optimum operation mode without awareness of the data transfer rate which is actually used.

Another Example of Application

The 2-bit prefetch operation has been described. Data to be prefetched may be formed of multiple bits (e.g., 4 bits) other than 2 bits. In the two-bit prefetch method, data is transferred to memory cells in different arrays. However, even-numbered and odd-numbered columns may be provided at one memory array, and data may be prefetched from these even-numbered and odd-numbered columns in the single array.

The data transfer modes may be switched based on a CAS latency other than the CAS latency of 4.

The SDRAMs have been described by way of example. However, the invention can be applied to various semiconductor memory devices provided that they operate in synchronization with external clock signals.

According to the invention, as described above, the internal data transfer modes are switched in accordance with the operation mode designating signal set in the mode register. Therefore, a user can operate the semiconductor memory device in the optimum operation mode without awareness of the internal data transfer mode. Also, a plurality of operation modes can be easily implemented by using one type of semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operable in synchronization with an externally applied external clock signal having a predetermined width, comprising:

a memory array having a plurality of memory cells;

internal clock generating means receiving said externally applied external clock signal, for generating an internal clock signal determining a data write cycle in synchronization with said external clock signal; and data write means for writing data into a selected memory cell in said memory array in synchronization with said internal clock signal in data writing mode of operation, said data write means being operable in a pipelined mode for writing different data into different memory cells every cycle of said internal clock signal and a prefetch mode for writing different data into a plurality of memory cells every multiple cycles of said internal clock signal;

a mode register for storing data determining an operation mode of said data write means; and mode setting means for setting the operation mode of said data write means to either of the pipelined mode and the prefetch mode in accordance with the data stored in said mode register.

2. The synchronous semiconductor memory device according to claim 1, wherein
   said mode register stores data representing the number of cycles of said external clock signal required from application of a data read instruction to external output of valid data.

3. The synchronous semiconductor memory device according to claim 1, wherein
   said mode register stores operation mode setting data representing a single rate mode for performing an input or output of data in synchronization with change in one direction in said clock signal and a double rate mode for performing the input or output of data twice in one cycle of said external clock signal, and
   said internal clock generating means includes means activated in accordance with said operation mode setting data to double a frequency of said external clock signal.

4. The synchronous semiconductor memory device according to claim 1, further comprising:

means for simultaneously selecting a plurality of memory cells in the memory cell array and simultaneously coupling said plurality of selected memory cells to said write means every said multiple cycles of the internal clock signal from said internal clock generating means.

5. The synchronous semiconductor memory device according to claim 4, wherein said data write means includes a plurality of data write buffers being activated circulatively and successively during said pipelined mode, and being successively activated every said multiple cycles of said internal clock signal during said prefetch mode such that all of said plurality of data write buffers are simultaneously activated in one of said multiple cycles and are simultaneously deactivated every said multiple cycles, and said data write buffers transmit the write data to the selected memory cells when said data write buffers are active.

6. The synchronous semiconductor memory device according to claim 5, further comprising a plurality of write register means provided corresponding to said data write buffers, respectively, receiving externally applied write data, and being successively activated every clock cycle of said internal clock signal to hold the received write data.

* * * * *